United States Patent
Futatsuya et al.

(10) Patent No.: US 6,483,748 B2
(45) Date of Patent: Nov. 19, 2002

(54) NONVOLATILE MEMORY WITH BACKGROUND OPERATION FUNCTION

(75) Inventors: Tomoshi Futatsuya, Hyogo (JP); Yoshikazu Miyawaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/729,415

(22) Filed: Dec. 5, 2000

(65) Prior Publication Data

US 2001/0053091 A1 Dec. 20, 2001

(30) Foreign Application Priority Data

Jun. 5, 2000 (JP) .......................................... 2000-167649

(51) Int. Cl.[7] .............................................. G11C 16/04
(52) U.S. Cl. ................................. 365/185.11; 365/185.21
(58) Field of Search ........................ 365/185.11, 185.21, 365/185.01

(56) References Cited

U.S. PATENT DOCUMENTS 5,245,572 A    9/1993  Kosonocky et al.
5,361,343 A *  11/1994 Kosonnocky et al. .. 365/185.11
5,521,864 A *  5/1996  Kobayashi et al. ..... 365/185.22
5,732,017 A *  3/1998  Schumann et al. ..... 365/185.11
5,847,994 A    12/1998 Motoshima et al.
5,847,998 A    12/1998 Van Buskirk
6,016,270 A *  1/2000  Thummalapally et al. ....... 365/185.11

FOREIGN PATENT DOCUMENTS

JP    6-180999    6/1994

* cited by examiner

Primary Examiner—Hoai V. Ho
(74) Attorney, Agent, or Firm—McDermott, Will & Emery

(57) ABSTRACT

An external read sense amplifier for reading out a data to an outside and an internal verify sense amplifier for reading out a data for an internal operation are provided, separately from each other, to a plurality of banks. Preferably, an internal verify sense amplifier is provided for each prescribed number of memory blocks. There is provided a nonvolatile semiconductor memory device with a background operation function, having a reduced chip occupancy area.

12 Claims, 16 Drawing Sheets

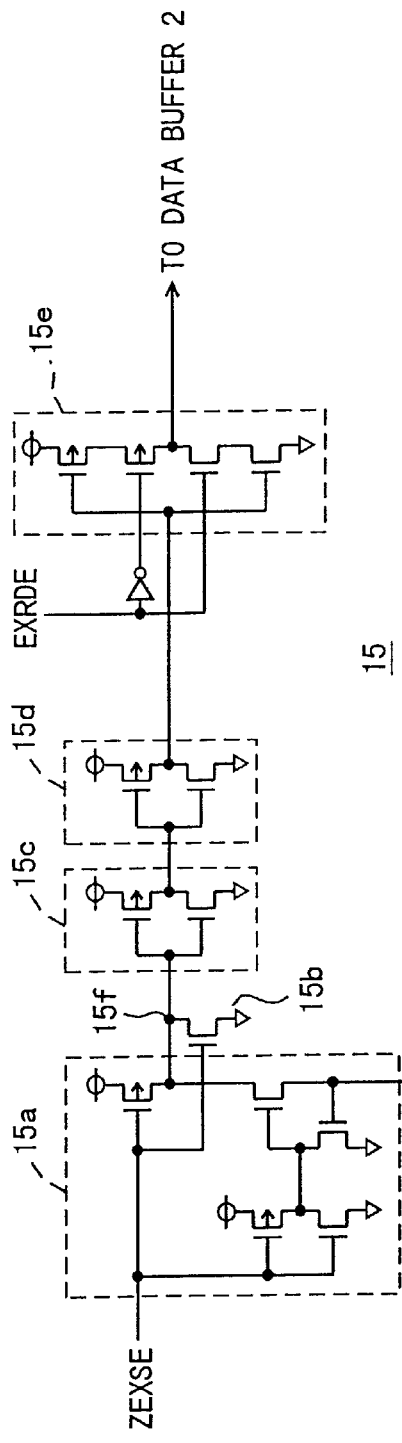
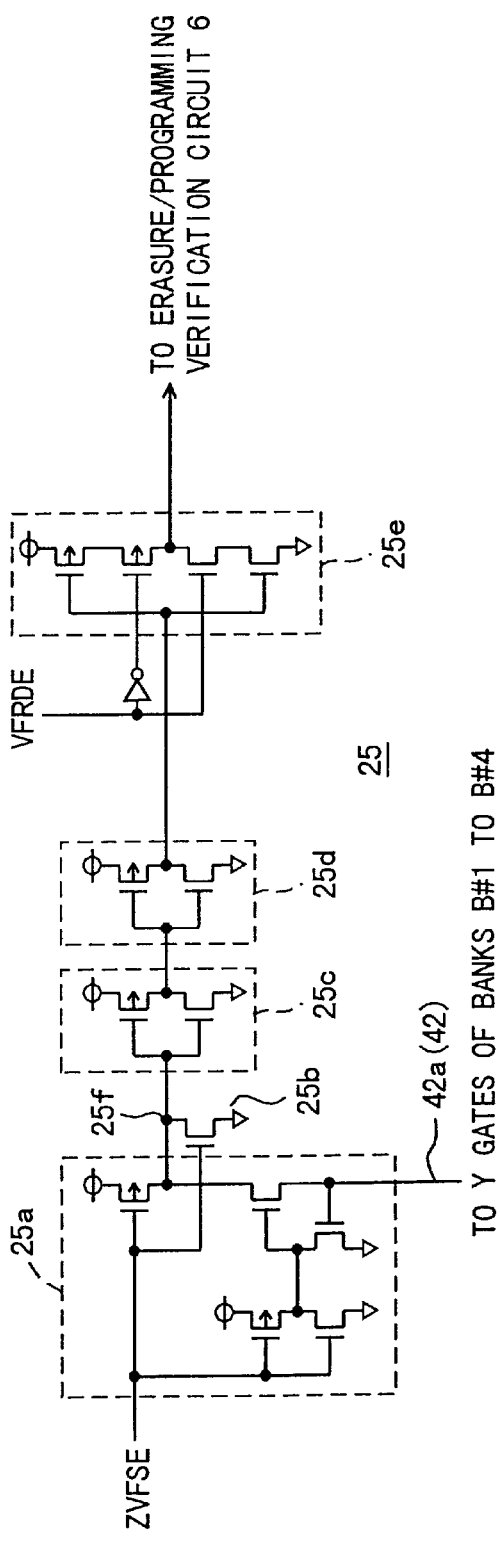
FIG. 9A
FIG. 9B

F I G. 1 4 A
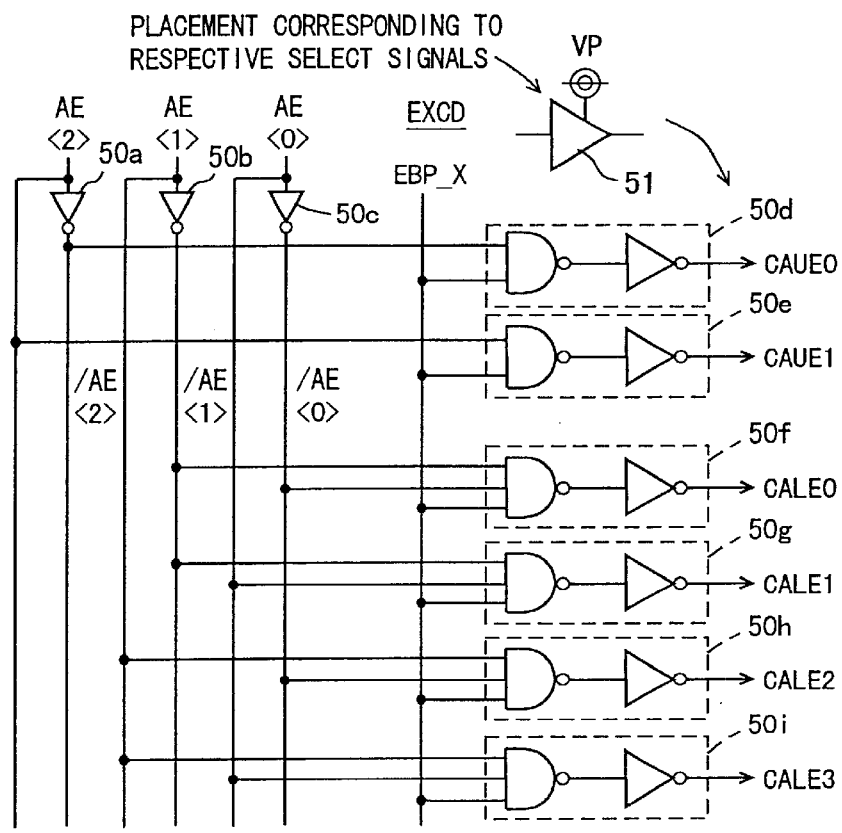
F I G. 1 4 B
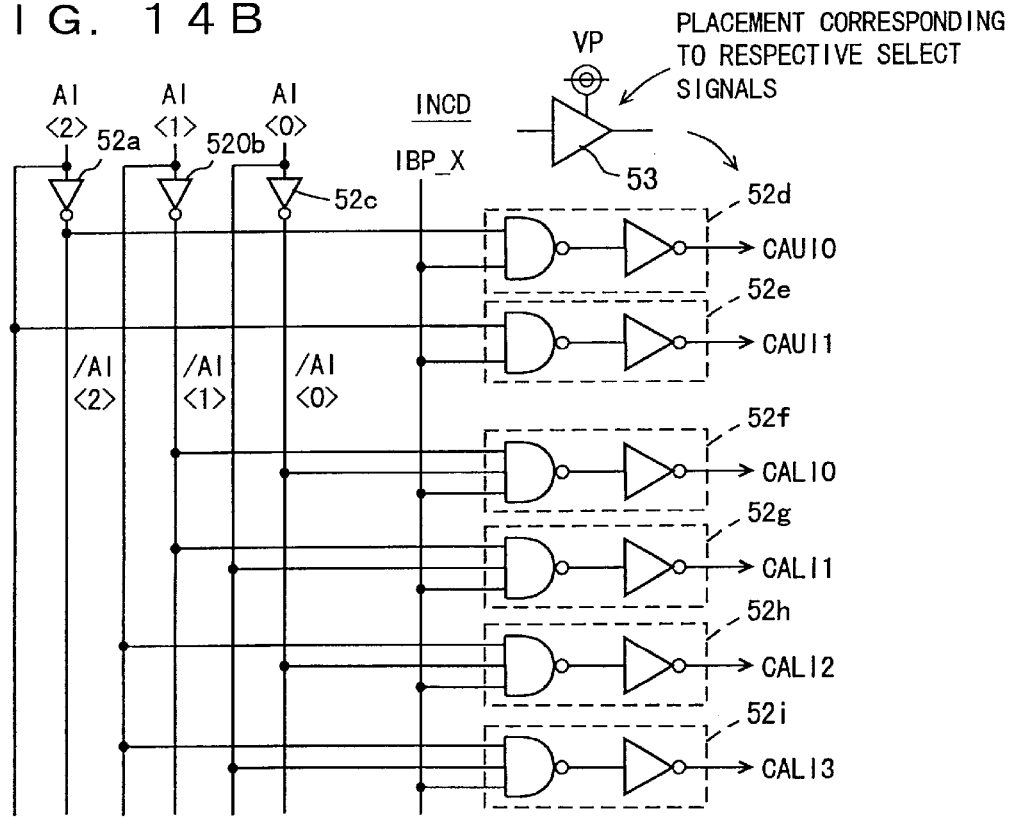

US 6,483,748 B2

NONVOLATILE MEMORY WITH BACKGROUND OPERATION FUNCTION

BACKGROUND OF THE INVENTION

1. Field of the Invention

The present invention relates to a nonvolatile semiconductor memory device and particularly, to a nonvolatile semiconductor memory device capable of operating in the background operation mode in which a data is externally read out in an erasure/programming operation in the interior thereof.

2. Description of the Background Art

FIG. 17 is a block diagram schematically showing a configuration of a conventional nonvolatile semiconductor memory device. In FIG. 17, the conventional nonvolatile semiconductor memory device includes a plurality of banks B#1 to B#4. Each of the banks B#1 to B#4 includes: a memory array MA having a plurality of nonvolatile memory cells arranged in rows and columns; a predecoder PD for predecoding a supplied address signal; a row decoder RD for decoding a row predecode signal supplied from the predecoder PD to select an addressed row of the memory array MA; a column decoder CD for decoding a column predecode signal supplied from the predecoder PD to generate a column select signal selecting an addressed column of the memory array MA; and a Y gate YG for selecting a corresponding column of the memory array MA according to the column select signal supplied from the column decoder CD. The banks B#1 to B#4 can be addressed independently and individually.

The nonvolatile semiconductor memory device further includes: an address buffer 1 taking in an address signal AD supplied externally therein according to a control signal CTL and generating an internal address signal to supply it to the banks B#1 to B#4; a data buffer 2 for inputting and outputting a data between the data buffer 2 and an external device; a write data buffer 4 receiving an internal write data from the data buffer 2 to store the data therein; write circuit and sense amplifier blocks 5a to 5d, provided corresponding to the respective banks B#1 to B#4, each transmitting a write data to a selected memory cell of a corresponding bank and reading a data from a selected memory cell of a corresponding bank; a bank pointer 3 for activating a bank specified by a bank address signal supplied from the address buffer 1; an erasure/programming verification circuit 6 receiving a verify data read out from the write circuit and sense amplifier blocks 5a to 5d and a write data stored in the write data buffer 4 in a write operation, and for verifying whether or not, in a selected bank, erasing has been correctly performed and whether or not, in a selected bank, data programming has been correctly performed; and internal control circuit 7 receiving a control signal CTL supplied externally, a command CMD specifying an operating mode supplied externally and a bank address signal supplied from the bank pointer 3, and controlling operations of the data buffer 2 and the bank pointer 3 but as well as setting an internal address signal generated from the address buffer 1 in an internal operation.

The control signal includes a chip enable signal /CE, a write enable signal /WE and an output enable signal /OE. The command CMD specifies a data erase mode, a data write mode and the like, and is supplied through a data bus.

The nonvolatile semiconductor memory device shown in FIG. 17 is a flash memory in which one memory cell is formed of one floating gate field effect transistor. Data storage in a memory cell is achieved by injection/extraction of electric charges to/from the floating gate of a floating gate field effect transistor to change a threshold voltage thereof.

It has been established that an access time for a data read operation ranges from 50 nsec (nanoseconds) to 200 nsec and on the other hand, an erasure/programming operation requires to change a threshold voltage of a memory cell transistor (in a unit of a memory block) and therefore, it takes a relatively long time ranging from 2 $\mu$s (microseconds) to 5 s (seconds). In the prior art, it is impossible to read out a data in the chip during an internal operation in which the erasure/programming operation is performed. In a case where a plurality of banks B#1 to B#4 are provided as shown in FIG. 17, however, while an internal operation for programming/erasing is performed on a bank, can be accessed for data reading from another bank. An operation in which while an internal operation is actually performed in one bank, a data can be read out from another bank, is called a BGO (background operation) function. In order to realize this BGO function, an external operation address signal and an internal operation address signal are generated from the address buffer and further, the write circuit and sense amplifier blocks 5a to 5d are provided corresponding to the respective banks B#1 to B#4. According to an operating mode, the write circuit and sense amplifier blocks 5a to 5d are coupled to either the erasure/programming verification circuit 6 or the data buffer 2. The selective connection is performed under control of the internal control circuit 7 according to a bank specifying signal supplied from the bank pointer 3.

FIG. 18 is a circuit diagram representing a construction of a sense amplifier included in each of the write circuit and sense amplifier blocks 5a to 5d shown FIG. 17. In FIG. 18, the sense amplifier includes: a current sense circuit 901, activated when a sense amplifier enable signal ZSE is activated, for amplifying a data transmitted through an internal data transmission line 900 from the Y gate YG; an N channel MOS transistor 902, made conductive when the sense amplifier enable signal ZSE is deactivated, for precharging a node 907 to the ground voltage level; two cascaded CMOS inverters 903 and 904 amplifying a signal on the node 907; an internal output circuit 905, activated when an external read output enable signal EXRDE is activated, for buffering (amplifying) a signal supplied from the CMOS inverter 904 to transmit the buffered signal to the data buffer 2; and an internal output circuit 906, activated when a verify output enable signal VFRDE is activated, for buffering (amplifying) an output signal of the CMOS inverter 904 to supply the output signal to the erasure/programming verification circuit 6.

The current sense circuit 901 includes: a P channel MOS transistor PQ1, made conductive when the sense amplifier enable signal ZSE is activated, for supplying a current to the node 907; a P channel MOS transistor PQ2 made conductive when the sense amplifier enable signal ZSE is activated and transmitting a power supply voltage when made conductive; an N channel MOS transistor NQ3 connected between the MOS transistor PQ2 and the ground node, and receiving the sense amplifier enable signal ZSE at a gate thereof; an N channel MOS transistor NQ 1 connected between the node 907 and the internal data line 900, and coupled with drains of the MOS transistors PQ2 and PQ3 at a gate thereof; and an N channel MOS transistor NQ2 connected in parallel to the MOS transistor NQ3, and connected to the internal data transmission line 900 at a gate thereof.

The first internal output circuit 905 includes: P channel MOS transistors PQ3 and PQ4 connected serially between a power supply node and a first output node; and N channel MOS transistors NQ4 and NQ5 connected serially between the first output node and a ground node. An output signal of the CMOS inverter 904 is supplied to the gates of the MOS transistors PQ3 and NQ5, and the external read output enable signal EXRDE is supplied to the gate of the MOS transistor PQ4 through an inverter. Further, the external read output enable signal EXRDE is supplied to the gate of the MOS transistor NQ4.

The second internal output circuit 906 includes: P channel MOS transistors PQ5 and PQ6 connected serially between a power supply node and a second output node; and N channel MOS transistors NQ6 and NQ7 connected serially between the second output node and a ground node. An output signal of the CMOS inverter 904 is supplied to the gates of the MOS transistors PQ5 and NQ7. The verify output enable signal VFRDE is supplied to the gate of the MOS transistor PQ6 through an inverter and further, the verify output enable signal VFRDE is supplied to the gate of the MOS transistor NQ6.

The internal data transmission line 900 is coupled to a selected column of a corresponding memory array through the Y gate YG. When the sense amplifier enable signal ZSE is inactive at H level, the MOS transistor PQ1 and PQ2 are turned off, while the MOS transistor NQ3 is turned on in the current sense circuit 901. Therefore, the gate of the MOS transistor NQ1 is coupled to a ground node through the MOS transistor NQ3, and the MOS transistor NQ1 is turned off to disconnect the node 907 and the internal data transmission line 900 from each other. Further, the MOS transistor 902 is turned on and the node 907 is fixed at the ground voltage level.

When the sense amplifier enable signal ZSE goes to L level of the active state, the MOS transistors PQ1 and PQ2 are turned on, while the MOS transistor NQ3 is turned off. Further, the MOS transistor 902 is turned off. Therefore, the node 907 is charged by the MOS transistor PQ1 toward the power supply voltage level. Further, the MOS transistor NQ1 receives the power supply voltage at the gate thereof through the MOS transistor PQ2, to turn on for coupling the node 907 with the internal data transmission line 900. Therefore, a voltage lower than the power supply voltage by a threshold voltage of the MOS transistor NQ1 is transmitted to the internal data transmission line 905 through the MOS transistor NQ1. When a threshold voltage of a memory cell on a column selected by the Y gate YG is low, a current flows through the memory cell and a voltage level on the internal transmission line 900 decreases and the MOS transistor NQ2 is turned off, a current flows from the MOS transistors PQ1 and NQ1 to the internal data transmission line 900 to reduce a voltage level of the node 907.

On the other hand, when a threshold voltage of a memory cell selected by the Y gate YG is high, no current flows through the selected memory cell and the internal data transmission line 900 goes to a voltage level charged by the MOS transistors PQ1 and NQ1. Accordingly, the MOS transistor NQ2 is turned on to discharge the gate of the MOS transistor NQ1 to the ground voltage level. Therefore, the MOS transistor NQ1 is turned off and the node 907 maintains H level charged by the MOS transistor PQ1. A voltage level of the node 907 is amplified by the CMOS inverters 903 and 904 and the amplified voltage is transmitted to the internal output circuits 905 and 906.

In the internal output circuit 905, when the external read output enable signal EXRDE is inactive at L level, the MOS transistors PQ4 and NQ4 are off and the internal output circuit 905 is in an output high impedance state. On the other hand, when the external read output signal EXRDE is activated at H level, the MOS transistors PQ4 and NQ4 are turned on and the internal output circuit 905 inverts the signal supplied from the CMOS inverter 904 and transmits the inverted signal to the data buffer 2. The data buffer 2 is activated under control of the internal control circuit 7 shown in FIG. 17 and buffers a data supplied from the internal output circuit 905 to output the buffered data to an outside.

When the verify output enable signal VFRDE is inactive at L level, the MOS transistors PQ6 and NQ6 in the internal output circuits 906 are off and the internal output circuit 906 is in the output high impedance state. When the verify output enable signal VFRED is activated at H level, the MOS transistors PQ6 and NQ6 are turned on and a signal from the CMOS inverter 904 is buffered and supplied to the erasure/programming verification circuit 6.

The erasure/programming verification circuit 6 identify, in an erasure operating mode, whether or not a signal supplied from the internal output circuit 906 is at a logical level corresponding to the erased state and determines whether or not erasing has been correctly effected. On the other hand, the erasure/programming verification circuit 6 identifies, in a program mode, whether or not a data supplied from the internal output circuit 906 is at a logic level corresponding a write data and determines whether or not data writing has been correctly effected. The output enable signals EXRDE and VFRDE are selectively activated by the internal control circuit 7 according to whether an internal operation or an external operation is effected, based on a signal generated from the bank pointer.

FIG. 19 is a circuit diagram representing a configuration of a Y gate shown in FIG. 17. FIG. 19 shows a portion including the Y gate for selecting a memory cell of one bit from memory cells of 8 bits. In FIG. 19, the Y gate YG includes: column select gates TR0 to TR3 each formed of an N channel MOS transistor, and provided corresponding to respective internal data lines DL0 to DL3, and made conductive when column select signals CAL0 to CAL3 are selected, respectively, and column select gates TR4 to TR7 formed of N channel MOS transistors, provided corresponding to respective internal data lines DL4 to DL7, and made conductive when column select signals CAL0 to CAL3 are selected, respectively.

The internal data lines DL0 to DL7 are, for example, bit lines in the memory array MA and a column of memory cells are connected to each of the lines DL0 to DL7. A column (an internal data line) is selected according to a column address in a set of the internal data lines DL0 to DL3 and in a set of the internal data lines DL4 to DL7 by the column select gates TR0 to TR 3 and TR4 to TR7, and the selected columns are coupled to respective global data lines GDL0 and GDL1.

The Y gate YG further includes block select gates TR8 and TR9 formed of N channel MOS transistors, provided corresponding to the global data lines GDL0 and GDL1, and made conductive when respective column block select signals CAU0 and CAU1 are activated to couple the corresponding global data lines GDL0 and GDL1 to the internal transmission line 900.

In the Y gate YG shown in FIG. 19, a total of 2 bits composed of one bit from the internal data line DL0 to DL3 and one bit from the internal data line DL4 to DL7 are selected according to the column select signal CAL0 to CAL3 and the two bits are transmitted to the respective global data lines GDL0 to GDL1. Then, one of the global lines GDL0 and GDL1 is coupled to the sense amplifier circuit through the internal transmission line 900 according to the column block select signals CAU0 and CAU1. The internal transmission line 900 is also coupled to the write circuit included in a corresponding write circuit and sense amplifier block 5 (5a to 5d), and data reading and data writing are effected through the Y gate YG.

It should be appreciated that the memory array MA is divided into a plurality of blocks and a plurality of bits are read out in parallel. In FIG. 19, although a configuration is shown in which a memory cell of 1 bit is simply selected from memory cells of 8 bits, a scale of the Y gate YG is expanded, proportional to the number of internal data lines included in one column block and the number of column blocks.

FIG. 20 is a circuit diagram representing an example of configuration of a column decoder shown in FIG. 17. In FIG. 20, the column decoder CD includes: an OR circuit 910 receiving an external read bank specifying signal EBP_X and an internal operation bank specifying signal IBP_X to generate a bank specifying signal BP_X; inverters 911 to 913 inverting predecode signals (or address signal bits) A0 to A2 to generate complimentary predecode signal /A0 to /A2; and column decode circuits 914 to 919, enabled when the bank specifying signal BP_X is activated, for performing a decode operation.

The column decode circuit 914 receives the predecode signal /A0 and the bank specifying signal BP_X to generate the column select signal CAL0. The column decode circuit 915 receives the predecode signals A0 and /A1, and the bank specifying signal BP_X to generate the column signal CAL1. The column decode circuit 916 receives the predecode signals /A0 and A1, and the bank specifying signal BP_X to generate the column select signal CAL2. The column decode circuit 917 receives the predecode signals A0 and A1, and the bank specifying signal BP_X to generate the column select signal CAL3. The column decode circuit 918 receives the predecode signal /A2 and the bank specifying signal BP_X to generate the column block select signal CAU0. The column decode circuit 919 receives the predecode signal A2 and the bank specifying signal BP_X to generate the column block select signal CAU1.

Level converters 920 are provided corresponding to the respective column select signals CAL0 to CAL3, and to the respective column block select signals CAU0 to CAU1. The level converters 920 each receive a high voltage VP as one operating power supply voltage and converts a voltage level of a corresponding signal from a normal operation power supply voltage to a high voltage VP while maintaining a logical level thereof. When a programming operation is performed, a level conversion of a selected column select signal is performed using level converter 920 in order that a high programming voltage is transmitted onto a selected column through a column select gate formed of an N channel MOS transistor as shown in FIG. 19.

The predecode signals A0 to A2 are supplied from the predecoder PD shown in FIG. 17. The column decode circuits 914 to 919 each are an AND type decode circuit and enabled when the bank specifying signal BP_X is activated at H level, to perform a decode operation. One of the column select signals CAL0 to CAL3 and one of the column block select signals CAU0 to CAU1 are driven to a selected state (H level) according to the predecode signals A0 to A2. With such driving to the selected state, one column (of memory cells) is selected in the memory array MA.

It should be appreciated that the predecode signals A0 to A2, and /A0 to /A2 may be address signal bits.

In the nonvolatile semiconductor memory device as shown in FIG. 17, a data can be read out from a bank through accessing that bank while an internal operation for erasing/programming is performed on another bank. It is necessary, however, to provide a write circuit and a sense amplifier circuit for each bank in order to realize the background operation (BGO) function. Especially, in a sense amplifier as shown in FIG. 18, output circuits are required to be provided for external data outputting and for an internal operation (for verifying), separately, and there arises a problem that an occupying area of a sense amplifier is larger. Specifically, when the number of banks is increased in order to improve an operating efficiency of the nonvolatile semiconductor memory device, the number of sense amplifiers increases proportionally, thereby resulting in great increase in chip occupied area.

SUMMARY OF THE INVENTION

It is an object of the present invention to provide a nonvolatile semiconductor memory device capable of suppressing increase in chip area with degradation of a background operation function even when the number of banks increases.

It is another object of the present invention to provide a flash memory with a background operation function being capable of increasing the number of banks while suppressing increase in number of internal data read circuits.

A nonvolatile semiconductor memory device according to one aspect of the present invention includes: a plurality of memory banks each having a plurality of nonvolatile memory cells; at least one sense amplifier for read operation, provided corresponding to a prescribed number of memory banks of the plurality of memory banks, for outputting externally a data read out from a corresponding bank through a buffer circuit; and an sense amplifier for internal operation, provided corresponding to the plurality of memory banks and separately from the sense amplifier for read operation, for reading out a memory cell data from a corresponding memory bank for a prescribed internal operation.

A nonvolatile semiconductor memory device according to another aspect of the present invention includes: a memory array having a plurality of nonvolatile memory cells arranged in a matrix of rows and columns; an external sense amplifier circuit for reading out a data on a selected memory cell of the memory array to an outside; an sense amplifier for internal operation, provided separately from the external sense amplifier circuit, for reading out a data from a selected memory cell of the memory array for a prescribed internal operation; and a select circuit for coupling the selected memory cell of the memory array to the external sense amplifier circuit and the sense amplifier for internal operation through different paths.

A nonvolatile semiconductor memory device according to still another aspect of the present invention is a nonvolatile semiconductor memory device with a background operation function, in which a plurality of internal data read paths are provided extending from one memory cell array.

By providing a sense read circuit for external reading corresponding to a prescribed number of memory banks, it is unnecessary to provide external read sense amplifiers corresponding to respective memory banks, thereby enabling a chip area to decrease.

By connecting a sense read circuit for external reading and a sense read circuit for an internal operation to a bank through different paths, efficient placement of the sense read circuit for an internal operation can be realized, thereby improving a layout efficiency and reducing a chip area.

Further, by providing a plurality of output paths for a memory array, an internal operation amplifier and an external read sense amplifier can be separately disposed in an efficient way and therefore, a chip area can be efficiently utilized to decrease a chip area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9A is a circuit diagram representing a configuration of an external read sense amplifier shown in FIG. 1, and FIG. 9B is a circuit diagram representing a configuration of an internal verify sense amplifier shown FIG. 1;

FIG. 14A is a circuit diagram representing a configuration of an external read column decoder shown in FIG. 12, and FIG. 14B is a circuit diagram representing a configuration of an internal operation column decoder shown in FIG. 12;

DESCRIPTION OF THE PREFERRED EMBODIMENTS

[First Embodiment]

Figure 1:
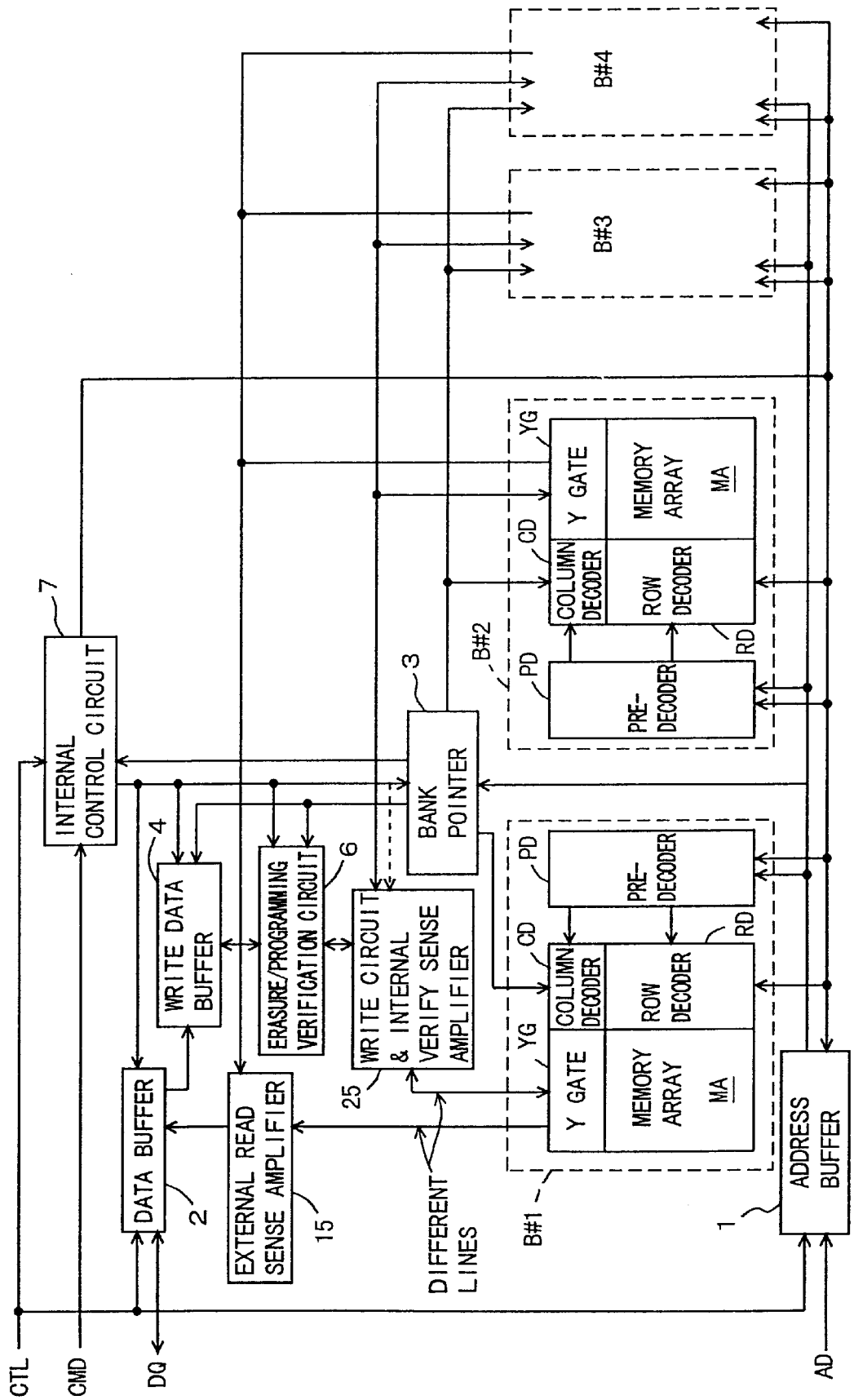
FIG. 1 is a block diagram schematically showing the entire configuration of a nonvolatile semiconductor memory device according to a first embodiment of the present invention.

FIG. 1 is a block diagram schematically showing the entire configuration of a nonvolatile semiconductor memory device according to a first embodiment of the present invention. In FIG. 1, the nonvolatile semiconductor memory device includes a plurality of banks B#1 to B#4 similar to the conventional case. The nonvolatile semiconductor memory device further includes: an external read sense amplifier 15 for reading out a data to an outside of the memory device through a data buffer 2; and a write circuit for internal writing and internal verify sense amplifier block 25 for erasure/programming verification provided commonly to the plurality of banks B#1 to B#4.

The external read sense amplifier 15 and the write circuit and internal verify sense amplifier block 25 are coupled to the banks B#1 to B#4 through different paths. Since the banks B#1 to B#4 are coupled to the external read sense amplifier 15, and the write circuit and internal verify sense amplifier block 25 through the different paths, a data can be read out from one of the banks B#1 to B#4 to the outside while an internal operation (programming/erasure operation) is effected on another bank.

The write circuit and internal verify sense amplifier block 25 are provided commonly to the banks B#1 to B#4 and therefore, no bank specifying signal from a bank pointer 3 is supplied to the block 25 but the write circuit and internal verify sense amplifier block 25 is activated only when a bank specifying signal for an internal operation is generated. The write circuit and internal verify sense amplifier block 25 is activated according to a control signal supplied from an internal control circuit 7. A control line to the write circuit and internal verify sense amplifier block 25 from the internal control circuit 7 is depicted with a short-dashed line in FIG. 1.

The external read sense amplifier 15 is also provided commonly to the banks B#1 to B#4 and when a data read command or a chip enable signal/CE is supplied from the outside, it is activated under control of the internal control circuit 7 (a line for this activation is not shown in FIG. 1). Alternatively, the external read sense amplifier 15 may be activated in synchronization with activation of a bank specifying signal when a read command instructing data read or the chip enable signal /CE is supplied. When a read enable signal /OE is supplied, a data output buffer included in the data buffer 2 is activated to perform external reading of a data. Therefore, for the purpose of external reading of a data, the signals /OE and /CE are both activated.

The banks B#1 to B#4 each include: a memory array MA having a plurality of nonvolatile memory cells arranged in a matrix of rows and columns; a row decoder RD for selecting a memory cell row (a word line); a column decoder CD generating a column select signal for selecting a column of the memory array MA; a predecoder PD predecoding an address signal supplied from the address buffer 1; and a Y gate YG coupling a selected column of the memory array MA to either the external read sense amplifier 15 or the write circuit and internal sense amplifier block 25 according to a column select signal supplied from the column decoder CD.

The column decoder CD, the row decoder RD and the predecoder PD are selectively activated according to a bank specifying signal supplied from the bank pointer 3. The Y gate YG has two data transmission paths, different from a conventional practice, and couples a selected column (an internal data line) to the external read sense amplifier 15 and the write circuit and internal verify sense amplifier block 25. The data buffer 2, the write data buffer 4 and the erasure/programming verification circuit 6 are provided commonly to the banks B#1 to B#4 similar to a conventional practice. Now, description will be given of operations of the nonvolatile semiconductor memory device shown in FIG. 1.

In an erasure operation, erasing is performed in a cell region (a sector or a block) to be erased in a selected bank. When the erasure operation is completed, the write circuit and internal verify sense amplifier block 25 is activated under control of the internal control circuit 7, a memory cell data that has been erased in the selected bank is read out by the internal verify sense amplifier, and the erased data is supplied to the erasure/programming verification circuit 6. It is determined in the erasure/programming verification circuit 6 whether or not a threshold voltage of the erased memory cell corresponds to an erased state. In a NOR flash memory, an "erasure" state means a state where a threshold voltage of a memory cell is lower than a predetermined value, while in a DINOR flash memory, an "erasure" state means a state where a threshold voltage of a memory cell is higher than a predetermined value.

According to the determination result in the erasure/programming verification circuit 6, the internal control circuit 7 supplies necessary voltages for erasing to a word line of a selected bank, the drain of a memory cell, the source thereof and a substrate region (supplies an erasure pulse). The erase/verify cycle is repeated till completion of erasing.

Next, description will be given of a write operation of a data to a selected memory cell. In the write operation, not only a control signal CTL but also a write command as a command CMD from outside of the chip are supplied. Subsequent to this, a write data and a write address AD are supplied together with a control signal CTL (a write enable signal /WE and a chip enable signal /CE). The write data is latched in the write data buffer 4 through the data buffer 2 (a write operation is collectively effected on a plurality of bits). On the other hand, an address signal AD supplied from the outside is latched in the address buffer 1 to generate an internal address signal AI. The command CMD is decoded in the internal control circuit 7 and when it is detected that data writing is specified, the internal control circuit 7 performs a necessary operation for writing.

That is, the internal control circuit 7 performs programming based on a write data latched in the write data buffer 4. In this case, the data latched in the write data buffer 4 is supplied to the write circuit of the write circuit and internal verify sense amplifier block 25 and the write data is transmitted to a selected bank from the write circuit included in the block 25.

The internal control circuit 7 applies necessary voltages to a word line, the drain and source of a memory cell and a substrate region, respectively, in a bank specified by a bank specifying signal generated by the bank pointer 3 for a necessary time. In other words, necessary voltage levels are applied for a necessary time duration to the column decoder CD, the row decoder RD and a substrate region of the memory array MA (a substrate region per sector), respectively.

The internal control circuit 7 performs internal reading of a data on a memory cell on which data programming has been performed, in order to verify whether or not a memory cell to be programmed reaches a required threshold voltage after completion of the programming operation. In this case, the internal verify sense amplifier included in the block 25 is again activated, a memory cell data that has been programmed is read out and further, in the erasure/programming verification circuit 6, it is determined whether or not a memory cell data coincides with a data that is latched in the write data buffer 4. This programming is to raise a threshold voltage of a memory cell above a predetermined value in a NOR flash memory, but to reduce a threshold voltage of a memory cell below a predetermined value in a DINOR flash memory. The internal control circuit 7 again applies a necessary voltage to each of nodes of to-be-written memory cells for a necessary time according to a verification result of the erasure/programming verification circuit 6, if programming is insufficient. In this programming operation, a programming pulse is transmitted to each region.

In this write operation, a bank B#i (i=1 to 4) that is to be written is coupled to the write circuit and internal verify sense amplifier block 25 and further the bank B#i is activated by the internal operation bank specifying signal supplied from the bank pointer 3. In this internal operation, a read command (signals OE and/activation of CE) for reading a data externally is supplied to specify the bank B#j (i≠j). At this time, in a case where a read mode is set by the signals /OE and /CE, the internal control circuit 7 activates the bank B#j that is to be accessed for data reading and performs data reading on a selected memory cell of the bank B#j using the external read sense amplifier 15 when an address signal AD (AE) supplied externally to the address buffer 1 specifies a bank B#j different from the bank B#i that is to be accessed for writing.

When data reading on the bank B#i is again instructed during the write operation on the bank B#i, the internal control circuit 7 reads out status information, generated normally in an internal operation and stored in a status register not shown, through the buffer 2 to the outside. A data stored in the status register indicates a status of the internal operation in progress in the nonvolatile semiconductor memory device 1.

Therefore, as shown in FIG. 1, the external read sense amplifier 15 and the internal verify sense amplifier are separately provided, and in addition, these amplifiers are coupled to the banks B#1 to B#4 through different paths, and thus the number of sense amplifiers can be decreased with no degradation in the background operation function. Further, since the write circuit and internal verify sense amplifier block 25 is provided commonly to the banks B#1 to B#4, the write circuit and internal verify sense amplifier block 25 can be disposed at a most optimal position, taking a layout of peripheral circuitry thereof into consideration, to enable improvement on an area utilization efficiency, with the result that a reduced chip area can be realized owing to not only decrease in number of circuits, but also improvement on area utilization efficiency.

Figure 2:
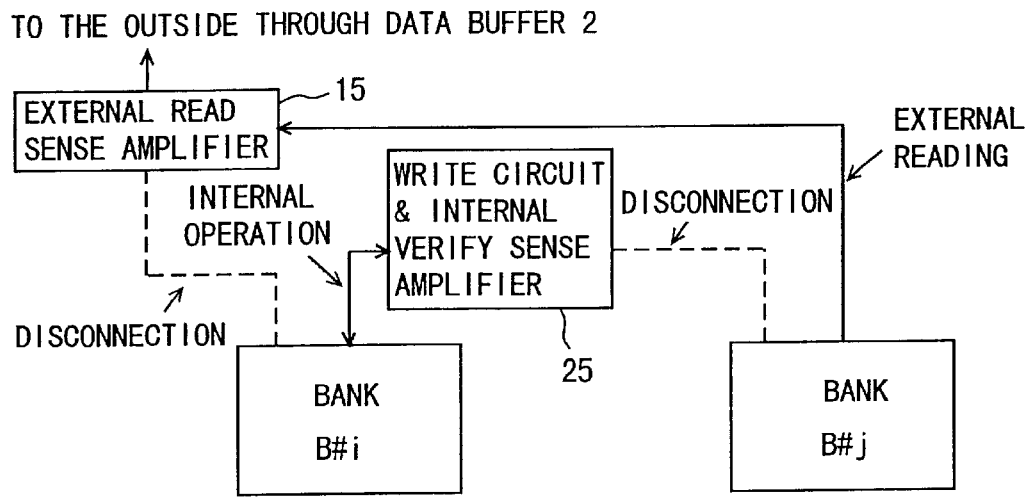
FIG. 2 is a block diagram schematically showing an internal connection state of the nonvolatile semiconductor memory device according to the first embodiment of the present invention.

That is, as shown in FIG. 2, when the bank B#i is coupled to the write circuit and internal verify sense amplifier block 25, and an internal operation thereon is performed, the bank B#j are disconnected from the write circuit and internal verify sense amplifier block 25. The bank B#j is coupled to the external read sense amplifier 15, for reading out a data on a selected memory cell of the bank B#j through the data buffer 2. In these operation, since the bank B#i is disconnected from the external read sense amplifier 15, no adverse influence due to an operation of the bank B#i is exerted on data reading from the bank B#j. Therefore, as shown in FIG. 2, different data input/output paths are provided to the external read sense amplifier 15 and the write circuit and internal verify sense amplifier block 25 and thereby, no degradation of the background operation function arises even when the external read sense amplifier 15 and the write circuit and internal verify sense amplifier block 25 are provided commonly to a plurality of banks.

[Configuration of Address Buffer]

Figure 3:
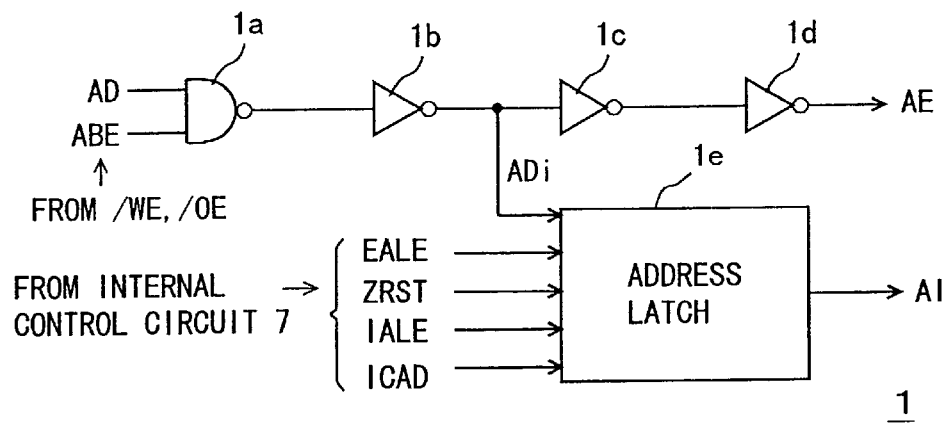
FIG. 3 is a block diagram schematically showing a configuration of an address buffer shown in FIG. 1.

FIG. 3 is a block diagram schematically showing a configuration of the address buffer 1 shown in FIG. 1. In FIG. 3, the address buffer 1 includes: a NAND circuit 1a receiving an address buffer enable signal ABE generated based on an address signal AD and the control signal CTL (/WE, /OE and /CE) supplied externally; an inverter 1b inverting an output signal of the NAND circuit 1a to generate an internal address signal ADi; two cascaded inverters 1c and 1d buffering the internal address signal ADi outputted by the inverter 1b to generate an external reading address signal AE; and an address latch 1e receiving an internal control address signal ICAD supplied from the internal control circuit 7 and the internal address ADi supplied from the inverter 1b, and selectively latching received address signals according to an external address latching enable signal EALE and an internal control address latching enable signal IALE to generate the internal operation address signal AI. The address latch 1e resets the internal operation address AI when a reset signal ZRST is active (at L level). The reset signal ZRST is activated when one internal operation is completed.

The internal control address signal ICAD is generated by the internal control circuit with the address signal AD supplied externally used as an initial address. For example, in a page mode operation or the like, an internal control address signal (a column address signal) is sequentially changed. In a data write operation as well, an address is sequentially updated from the initial address by the internal control circuit 7 internally provided. A memory cell of a selected bank is selected for data reading according to the external read address signal AE, and a data on the selected memory cell is read out externally through the external read sense amplifier 15 and the data buffer 2. A selected memory cell of a bank subject to an internal operation according to the internal operation address signal AI is coupled to the write circuit and internal verify sense amplifier block 25.

Figure 4:
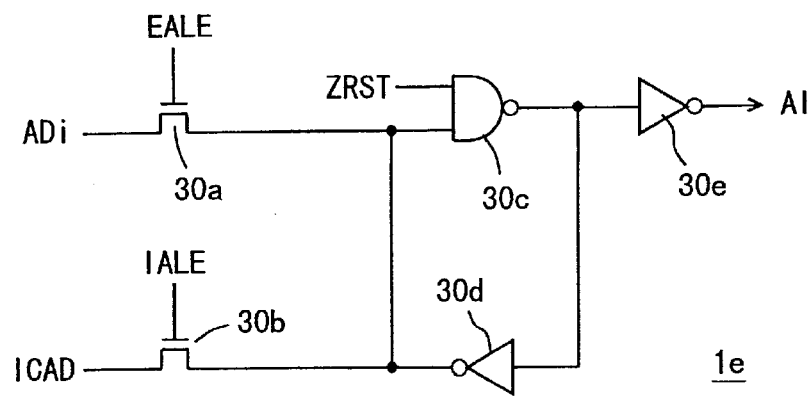
FIG. 4 is a circuit diagram schematically showing an address latch shown in FIG. 3.

FIG. 4 is a circuit diagram representing an example of configuration of the address latch 1e shown in FIG. 3. In FIG. 4, an address latch 1e includes: a transfer gate 30a, made conductive when the external address latching enable signal EALE is active (at H level) to pass the internal address signal ADi therethrough; a transfer gate 30b made conductive when the internal control address loading enable signal IALE is active (at H level) to pass the internal control address signal ICAD therethrough; a NAND circuit 30c receiving the reset signal ZRST at a first input, and receiving an address signal supplied from one of the transfer gates 30a and 30b at a second input; an inverter 30c inverting an output signal of the NAND circuit 30c to feed back the inverted signal to the second input of the NAND circuit 30d; and an inverter 30e inverting an output signal of the NAND circuit 30c to generate the internal operation address signal AI.

The NAND circuit 30c operates as an inverter when the reset signal ZRST is inactive at H level, a latch circuit (an inverter latch) is constructed of the NAND circuit 30c and the inverter 30d, and an address signal supplied from the transfer gate 30a or 30b is latched in the latch circuit. When the reset signal ZRST is activated, an output signal of the NAND circuit 30c goes to H level and responsively, all the bits of the internal operation address signal AI are reset to "0" (to L level). The internal operation address signal AI supplied from the address latch 1e and the external read address signal AE supplied from the address buffer are supplied commonly to the banks B#1 to B#4 shown in FIG. 1. Further, the address signals AE and AI are also supplied to the bank pointer 3. It is identified which of external and internal reading is specified by a bank specifying signal generated by the bank pointer 3.

[Configuration of Bank Pointer]

Figure 5:
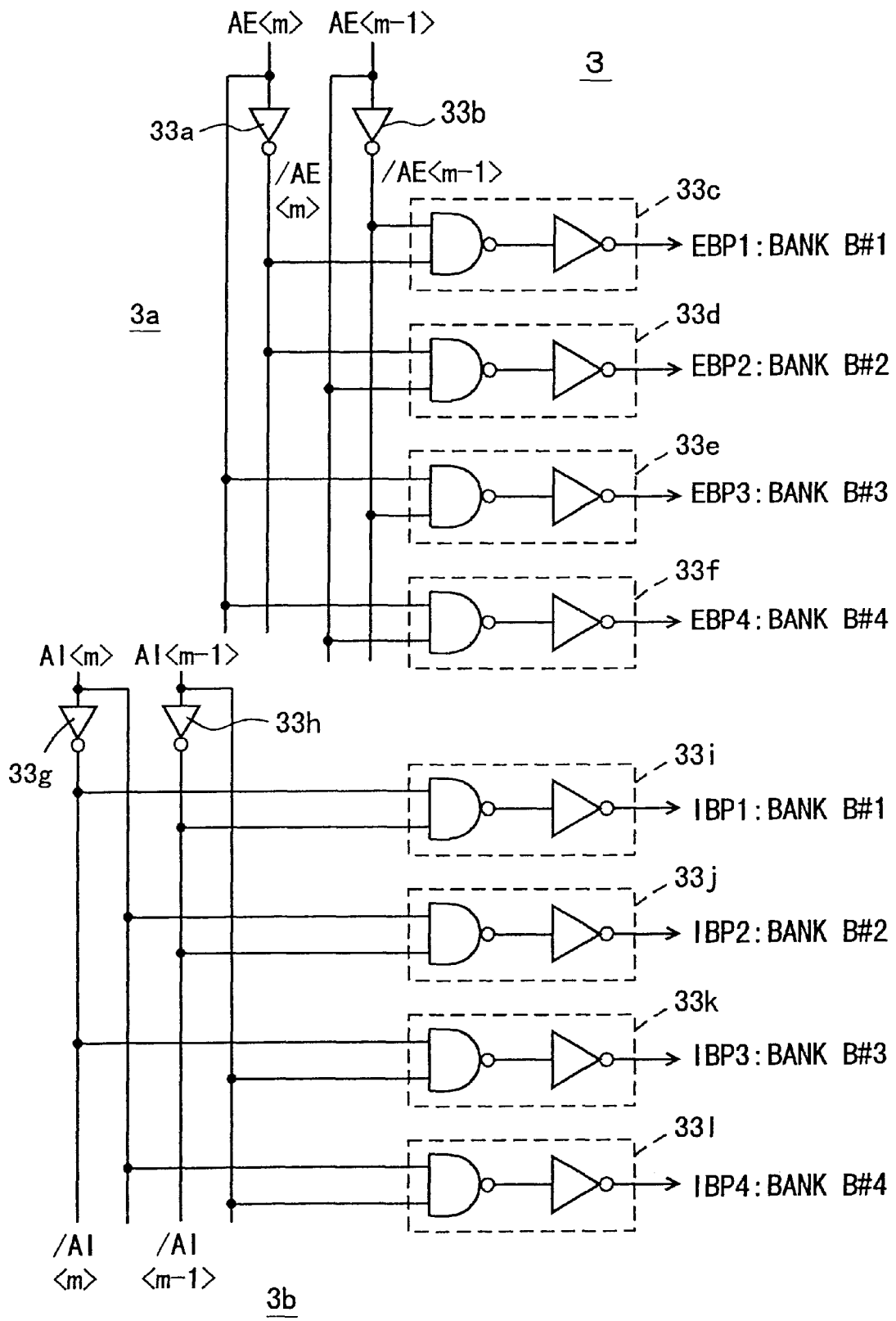
FIG. 5 is a circuit diagram representing a configuration of a bank pointer shown in FIG. 1.

FIG. 5 is a circuit diagram representing a configuration of the bank pointer 3 shown in FIG. 1. The bank pointer 3 decodes upper bits of the external read address signal AE and the internal operation address signal AI to generate bank specifying signals specifying banks for external reading and internal reading, respectively. The number of address signal bits decoded by the bank pointer 3 is determined according to the number of banks. In the first embodiment, the banks B#1 to B#4 are provided and a bank specifying signal is generated using the 2 most significant bits of each of the address signals AE and AI.

Specifically, in FIG. 5, the bank pointer 3 includes: an external read bank decode circuit 3a generating external read bank specifying signals EBP1 to EBP4 according to the external read address signal bits AE<m> and AE<m−1>; and an internal operation bank decode circuit 3b receiving internal operation address bits AI<m> and AI<m−1> to generate internal operation bank specifying signals IBP1 to IBP4.

The external read bank decode circuit 3a includes: an inverter 33a inverting the address signal bit AE<m>to generate a complementary address signal bit /AE<m>; an inverter 33b inverting the address signal bit AE<m−1> to generate a complementary address signal bit /AE<m−1>; and AND decode circuits 33c to 33f provided corresponding to the respective bank specifying signals EBP1 to EBP4.

The AND decode circuit 33c receives the address signal bits /AE<m> and /AE<m−1> supplied from the inverters 33a and 33b. The AND decode circuit 33d receives the address signal bits /AE<m> supplied from the inverters 33a and AE<m−1>. The AND decode circuit 33e receives the address signal bit AE<m> and the complementary address signal bit /AE<m−1> supplied from the inverters 33b. The AND decode circuit 33f receives the address signal bits AE<m> and AE<m−1>. When the bank specifying signals EBP1 to EBP4 are activated, respective bank B#1 to B#4 are activated.

The internal operation bank decoder 3b includes: inverters 33g and 33h inverting the internal operation address signal bits AI<m> and AI<m−1>, respectively, and AND decode circuits 33i to 33l generating the internal operation bank specifying signals IBP1 to IBP4, respectively.

The AND decode circuit 33i receives complementary address signal bits /AI<m> and /AI<m−1> supplied from the inverters 33g and 33h. The AND decode circuit 33j receives the address signal bit AI<m> and the complementary address signal bit /AI<m−1> supplied from the inverter 33i. The AND decode circuit 33k receives the complementary address signal bit /AI<m> supplied from the inverter 33g and the address signal bit AI<m−1>. The AND decode circuit 33l receives the address signal bits AI<m> and AI<m−1>. The internal operation bank specifying signals IBP1 to IBP4 activate the respective banks B#1 to B#4 for internal operation when activated.

[Configuration of Column Select Circuit]

Figure 6:
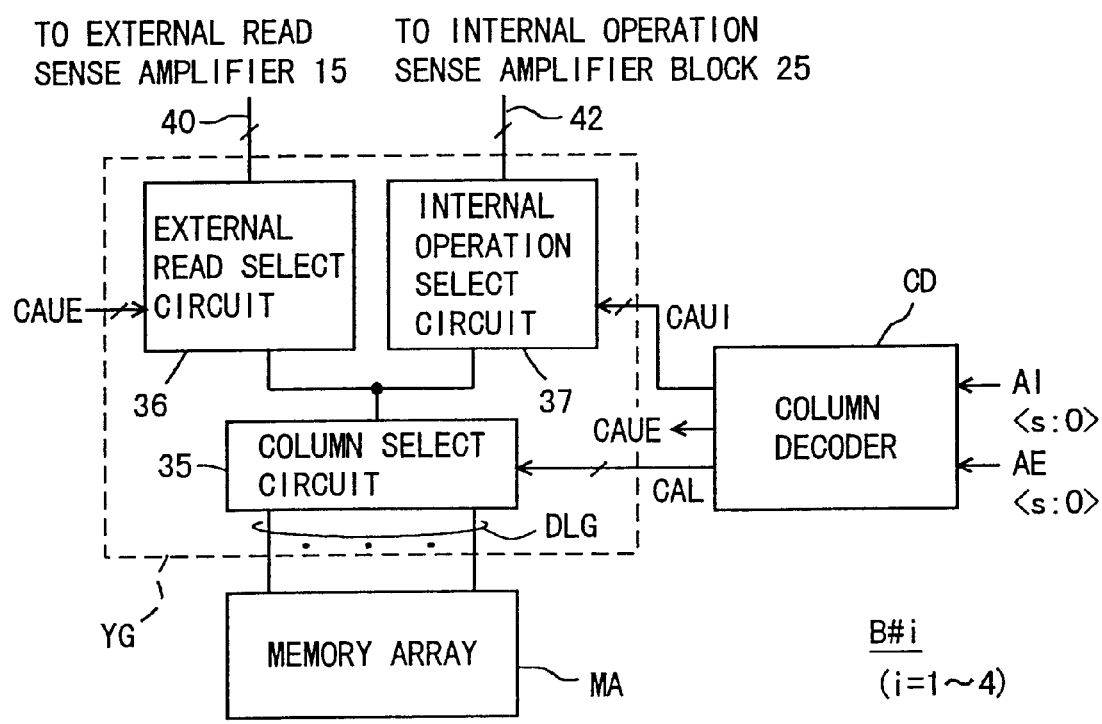
FIG. 6 is a block diagram schematically showing a configuration of a Y gate shown in FIG. 1.

FIG. 6 is a block diagram schematically showing a configuration of the circuitry related to column selection in one bank B#i (i=1 to 4). The column select circuit includes: a column decoder CD; and a Y gate YG. The column decoder CD receives internal operation address signal bits (or a predecode signal) AI<s:0> and an external read address signal bits (or a predecode signal) AE<s:0>to generate a column select signal CAL and path select signals CAE and CAI. Prescribed bits of the internal operation address signal bits AI<s:0> are decoded to generate an internal operation select signal CAI, while prescribed bits of the external read address signal bits AE<s:0> are decoded to generate an external read select signal CAE. The column select signal CAL is generated based on the address signal bits AI<s:0> and AE<s:0>. Bits AE<m−2:s+1> and AE<m−2:s+1> each are a row address and supplied to the row decoder.

Although a predecode operation is performed by the predecoder PD and a predecode signal is supplied to the column decoder, description below will be given of a configuration in which address bits are directly decoded for simplicity of description. Address predecoding can be realized by replacing address signal bits with a predecode signal.

The Y gate YG includes: a column select circuit 35 selecting an addressed column from an internal data line group DLG of the memory array MA according to the column select signal CAL supplied from the column decoder CD; an external read select circuit 36 for connecting a prescribed number of columns of columns selected by the column select circuit 35 according to a path select signal CAUE supplied from the column decoder CD to the external read sense amplifier 15; and an internal operation select circuit 37 connecting a prescribed number of columns of the columns selected by the column select circuit 35 according to an internal operation select signal CAUI supplied from the column decoder CD to the internal operation sense amplifier block 25. The external read select circuit 36 is coupled to the external read sense amplifier 15 through an internal data transmission line 40 and the internal operation select circuit 37 is coupled with the internal operation sense amplifier block 25 through an internal transmission line 42.

Since the external read select circuit 36 and the internal operation select circuit 37 are provided in the Y gate YG, a selected column of the memory array MA can be selectively connected to the external read sense amplifier 15 or the internal verify sense amplifier block 25 through the different internal data transmission lines 40 and 42, and therefore, in parallel to an internal operation at one bank, a data can be read out from another bank.

Figure 7:
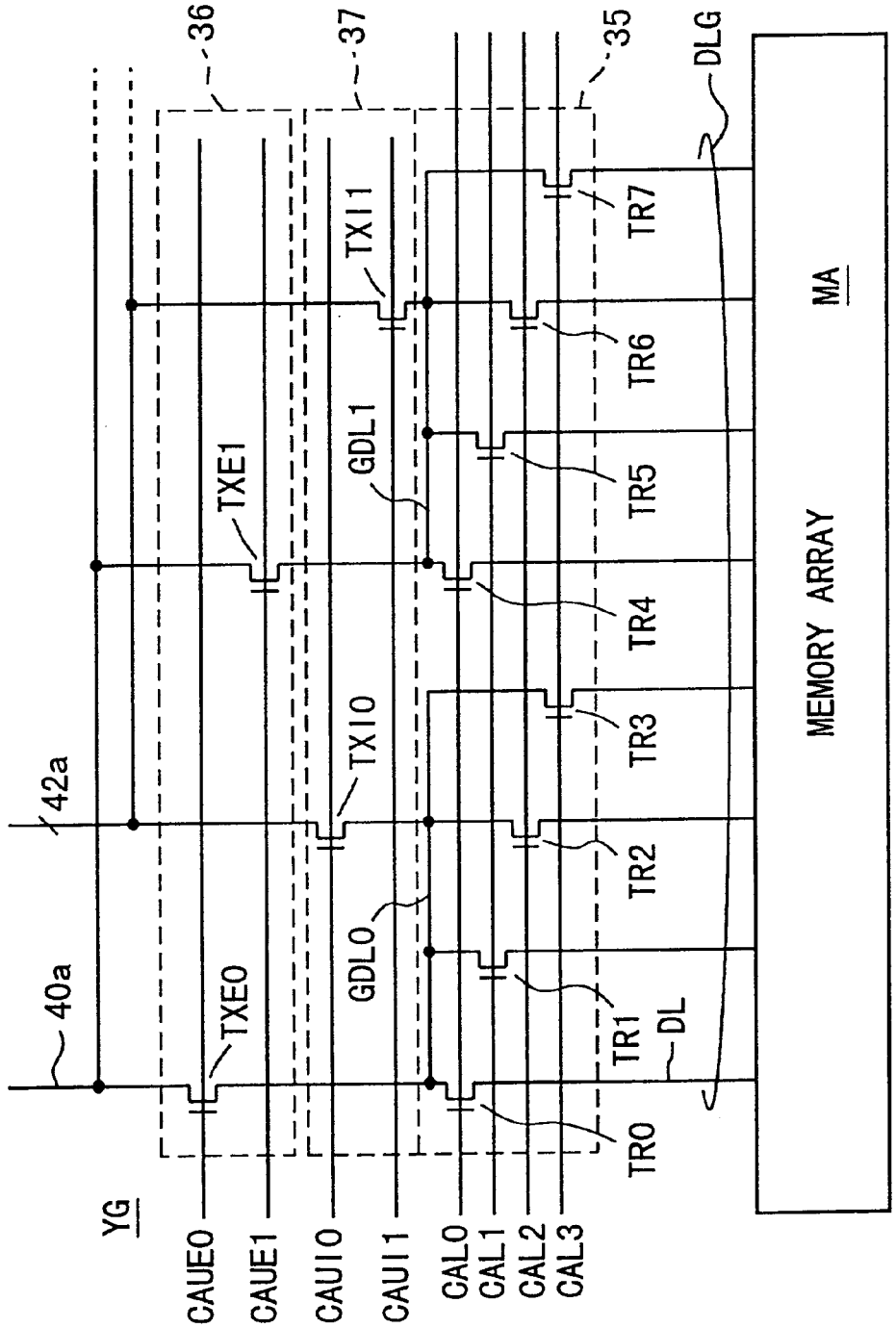
FIG. 7 is a circuit diagram specifically showing the configuration of the Y gate shown in FIG. 6.

FIG. 7 is a circuit diagram representing the configuration of the Y gate YG shown in FIG. 6. In FIG. 7, a configuration is shown of a portion for selecting a memory cell of one bit in the Y gate YG. The memory array MA is divided into a plurality of blocks, one column is selected by the column select circuit 35 in each of the plurality of blocks and each selected column is connected to a global data line GDL (GDL0 and GDL1). One of the global lines GDL0 and GDL1 is coupled with the external read sense amplifier or the internal operation sense amplifier by the external read select circuit 36 and the internal operation select circuit 37 through internal data transmission lines 40a or 42a.

Figure 19:
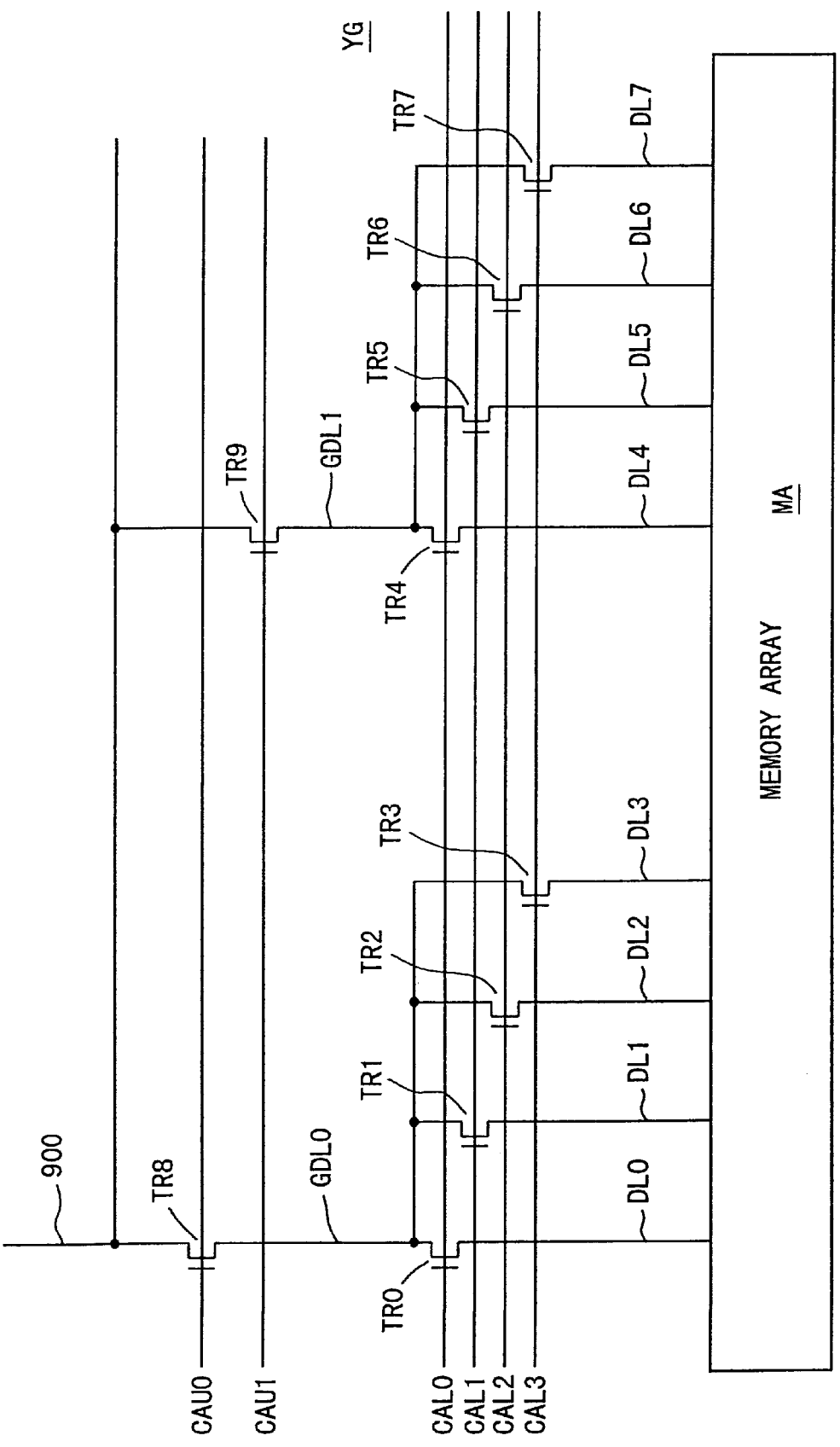
FIG. 19 is a circuit diagram representing a configuration of a conventional Y gate.
Figure 20:
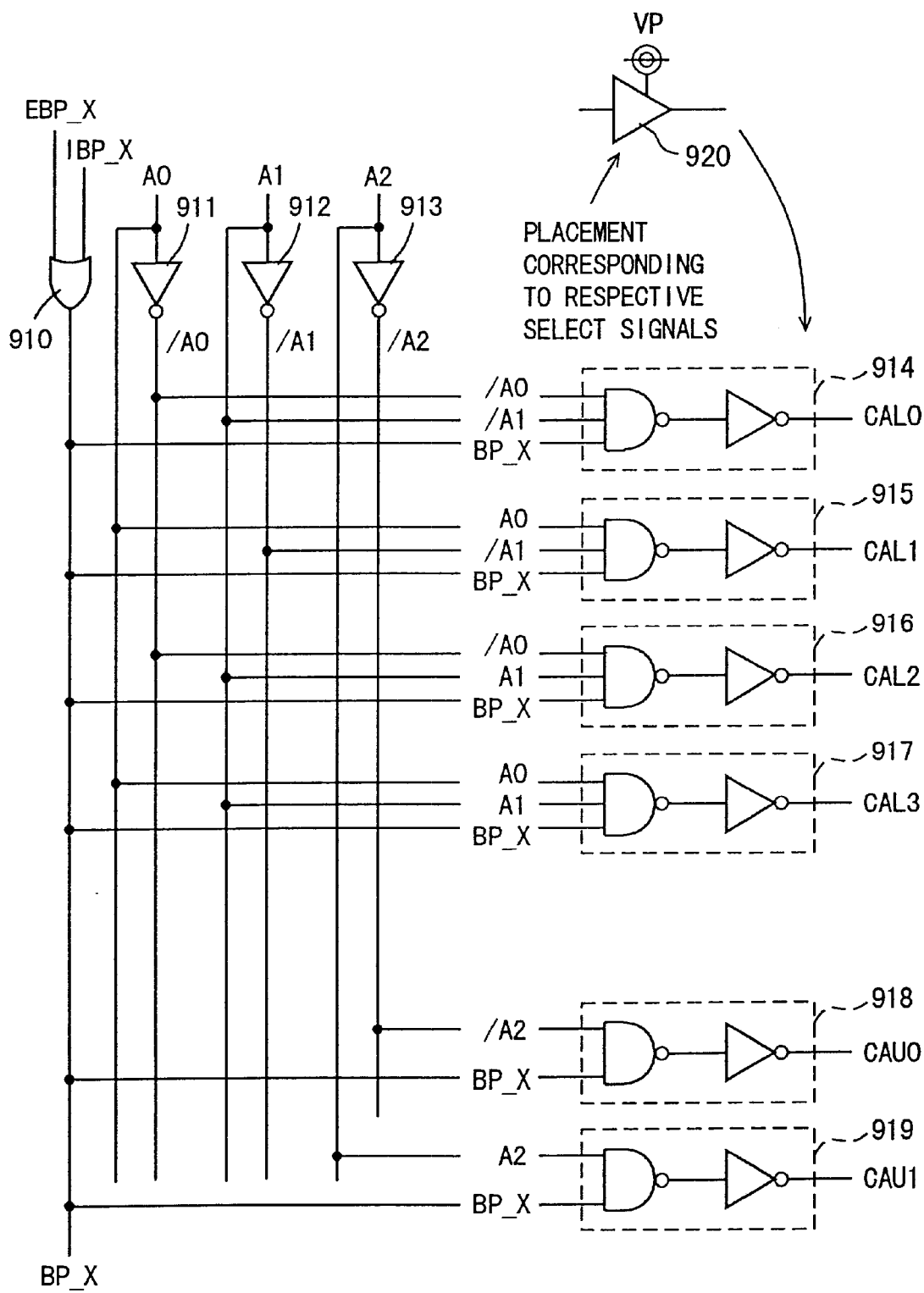
FIG. 20 is a circuit diagram representing a configuration of a conventional column decoder.

Here, a case is shown where one block is constructed of 4 columns, as an example, and column select signals CAL0 to CAL3 are generated as the column select signal CAL. A configuration of the column select circuit 35 is the same as the configuration of a portion responsive to the column select signals CAL0 to CAL3 of the conventional Y gate YG shown FIG. 19 and corresponding components are indicated by the same reference numerals. Specifically, transfer gates TR0 to TR3 and TR4 to TR7 are disposed on respective data lines DL of an internal data line group DLG of a memory array MA, and one of the transfer gates TR0 to TR3 and one of the transfer gates TR4 to TR7 are simultaneously turned on, and selected columns of the memory array MA are connected in parallel to the global data lines GDL0 and GDL1.

The external read select circuit 36 includes transfer gates TXE0 and TXE1 provided corresponding to the respective global data lines GDL0 and GDL1, and made conductive in response to external read line select signal CAUE0 and CAUE1, respectively to connect selected global data lines GDL0 and GDL1 to the internal data transmission line 40a.

The internal operation select circuit 37 includes transfer gates TXI0 and TXI1 provided corresponding to the respective global data lines GDL0 and GDL1, and made conductive in response to respective internal operation line select signals CAUI0 and CAUI1 to connect the global data lines GDL0 and GDL1 selectively to the internal data transmission line 42a. The internal data transmission lines 40a and 42a each transmit a memory cell data of one bit and are included in the internal data lines 40 and 42 shown in FIG. 6, respectively.

In the configuration of the Y gate YG shown in FIG. 7, the external read select circuit 36 and the internal operation select circuit 37 perform column select operations according to the respective column select signals CAUE and CAUI supplied from the column decoder CD. When the external read select circuit 36 is inactive, the transfer gates TXE0 and TXE1 are off and the internal data transmission line 40a is disconnected from the global data lines GDL0 and GDL1. Likewise, when the internal operation select circuit 37 is inactive, the transfer gates TXI0 and TXI1 are off and the internal data transmission line 42a is disconnected from the global data lines GDL0 and GDL1. Therefore, when an internal operation is performed in one memory array, the one memory array in which the internal operation is being performed is disconnected from the internal data line 40a, and another bank can transmit a data to the external read sense amplifier through the internal data line 40a.

Figure 8:
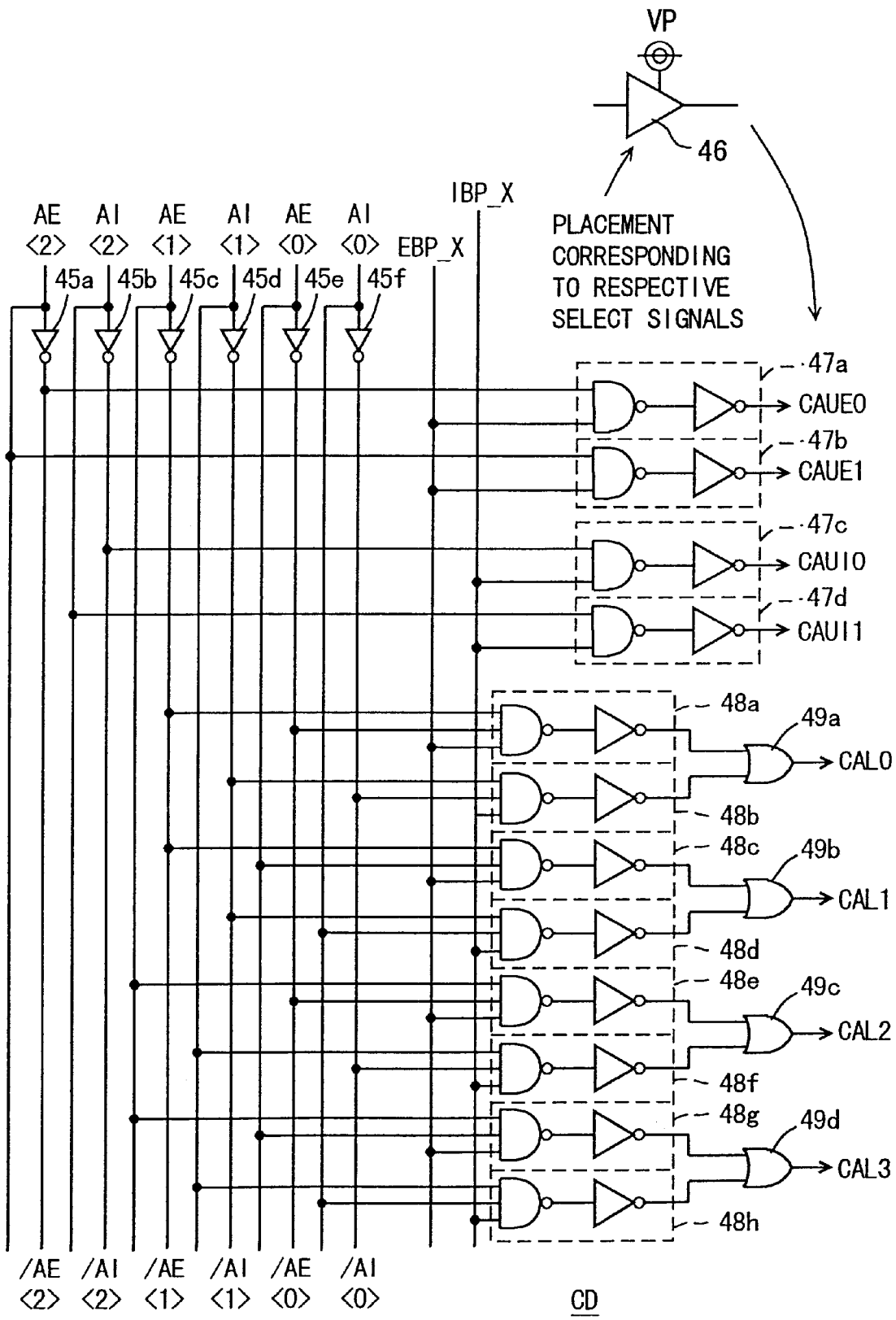
FIG. 8 is a circuit diagram representing a configuration of a column decoder shown in FIG. 6.

FIG. 8 is a circuit diagram representing a configuration of the column decoder shown in FIG. 6. In FIG. 8, the column decoder CD includes: inverters 45a to 45f receiving address signal bits AE<2>, AI<2>, AE<1>, AI<1>, AE<0> and AI<0>; and 2-input AND decode circuits 47a to 47d generating path select signals (column block select signals) CAUE0, CAUE1, CAUE1, CAUI0 and CAUI1 based on address signal bits AE<2>, AI<2>, /AE<2> and /AI<2>, and bank specifying signals EBP_X and IBP_X. The AND decode circuit 47a receives the address signal bit /AE<2> and the bank specifying signal EBP_X to generate the path select signal CAUE0. The AND decode circuit 47b receives the address signal bit AE<2> and the bank specifying signal EBP_X to generated the path select signal CAUE1. The AND decode circuit 47c receives the address signal bit /AI <2> and the bank specifying signal IBP_X to generate the path select signal CAUI0. The AND decode circuit 47d receives the address signal bit AI <2> and the bank specifying signal IBP_X to generate the path select signal CAUI1. The bank specifying signals EBP_X and IBP_X are generated from the bank pointer 3 (see FIG. 5) and specifies a bank #X (X=1 to 4).

The column decoder CD further includes 3-input AND decode circuits 48a to 48h. The AND decode circuit 48a receives the address signal bits /AE<1> and /AE <0> and the bank specifying signal EBP_X. The AND decode circuit 48b receives the address signal bits /AI <1> and /AI <0> and the bank specifying signal IBP_X. The AND decode circuit 48c receives the address signal bits /AE <1> and AE <0> and the bank specifying signal EBP_X. The AND decode circuit 48d receives the address signal bits /AI <1> and AI <0> and the bank specifying signal IBP_X. The AND decode circuit 48e receives the address signal bits /AE <1> and /AE <0> and the bank specifying signal UBP_X. The AND decode circuit 48f receives the address signal bits AI <1> and /AI <0> and the bank specifying signal IBP_X. The AND decode circuit 48g receives the address signal bits AE <0> and AE <1> and the bank specifying signal EBP_X. The AND decode circuit 48h receives the address signal bits AI <1> and AI <0> and the bank specifying signal IBP_X.

The column decoder CD further includes: an OR circuit 49a receiving output signals of the AND decode circuits 48a and 48b to generate the column select signal CAL0; an OR circuit 49b receiving output signals of the AND decode circuits 48c and 48d to generate the column select signal CAL1; an OR circuit 49c receiving outputs signals of the AND decode circuits 48e and 48f to generate the column select signal CAL2; and an OR circuit 49d receiving output signals of the AND decode circuits 48g and 48h to generate the column select signal CAL3.

Level converters 46 converting voltage levels of the select signals CAUE0, CAUE1, CAUI0, CAUI1 and CAL0 to CAL3 are provided corresponding to the respective select signals in an output of the column decoder CD. The level converters 46 each converts a supplied signal at an operating power supply voltage to a signal at a high voltage VP level. The level converters 46 each perform no conversion of a logical level. In a write operation, a high programming voltage is transmitted onto a selected column by the high voltage VP without any influence of a threshold voltage loss of a select gate in the Y gate.

The column decoder CD performs a column select operation when one of the external read bank specifying signal EBP_X and the internal operation bank specifying signal IBP_X is activated and further, a path select signal is generated (activated) according to the signals EBP_X and IBP_X. A column select operation in the memory array is the same between an internal operation and an external read operation, and a selected column is connected to one of the external read sense amplifier and the verify sense amplifier (and the write circuit) according to whether the column selection is made in an external operation or in an internal read operation. Therefore, by using the column decoder CD shown in FIG. 8, a column select operation and a path select operation can be performed according to an address signal (a predecode signal) in any of the internal operation and the external read operation.

[Configuration of Sense Amplifier]

FIG. 9A is a circuit diagram representing a configuration of the external read sense amplifier 15. In FIG. 9A, the external read sense amplifier 15 includes: a current sense circuit 15a for sensing the presence or non-presence of a current flowing through the internal data transmission line 40a; a precharge transistor 15b, conductive when an external read sense amplifier enable signal ZEXSE is deactivated, for precharging a node 15f to the ground voltage level; a CMOS inverter 15c inverting a signal of the node 15f; a CMOS inverter 15d inverting an output signal of the CMOS inverter 15c; and clocked inverter 15e inverting an output signal of the CMOS inverter 15d when the sense amplifier output enable signal EXRDE is activated.

Figure 18:
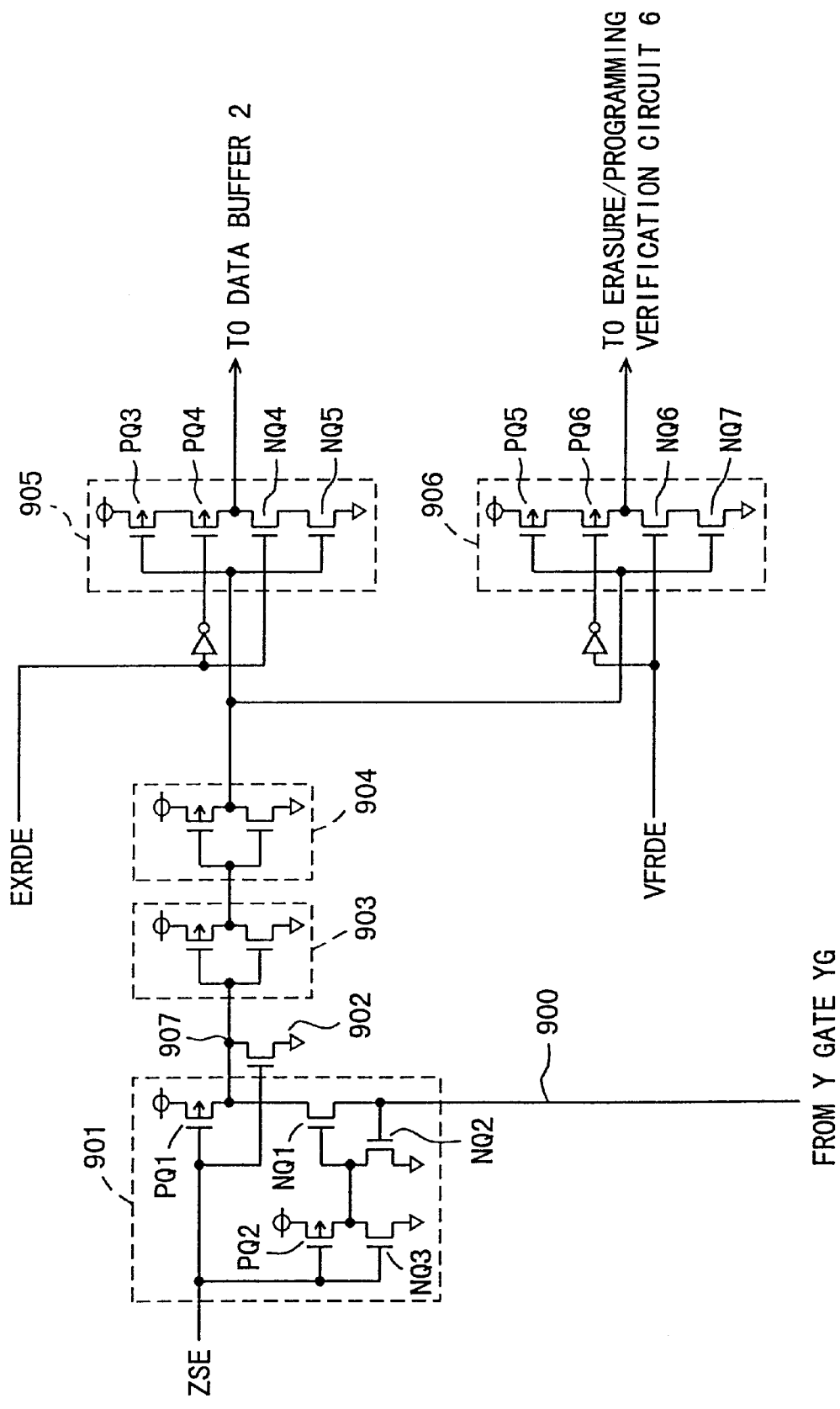
FIG. 18 is a circuit diagram representing a configuration of a conventional sense amplifier.

The configuration shown in FIG. 9A is equivalent to a configuration obtained by removing the internal output circuit 906 transmitting a data to the erasure/programming verification circuit from the conventional sense amplifier shown in FIG. 18, and corresponding circuits are of the same structure in the arrangements of FIGS. 9A and 18. The current sense circuit 15a is activated when the external read sense amplifier enable signal ZEXSE is activated to sense a data transmitted onto the internal data transmission line 40a (40). The internal data transmission line 40a (40) is coupled commonly with the Y gates YG of the banks B#1 to B#4.

FIG. 9B is a circuit diagram representing a configuration of a verify sense amplifier included in the write circuit and verify sense amplifier block 25. In FIG. 9B, the verify sense amplifier includes: a current sense circuit 25a sensing the presence or non-presence of a current on the internal data transmission line 42a when the verify sense amplifier enable signal ZVFSE is activated;-a precharge transistor 25b precharging a node 25f to the ground voltage level when the sense amplifier enable signal ZVFSE is deactivated; a CMOS inverter 25c inverting a signal of the node 25f; a CMOS inverter 25d inverting an output signal of the CMOS inverter 25c; and a clocked inverter 25e activated when the verify sense amplifier output enable signal VFRDE is activated, and inverting an output signal of the CMOS inverter 25d to transmit the signal to the erasure/programming verification circuit 6.

A configuration of the verify sense amplifier shown in FIG. 9B is equivalent to a configuration obtained by removing the internal output circuit 905 transmitting a data to the data buffer from the conventional sense amplifier shown in FIG. 18. The internal data transmission line 42a (42) is coupled commonly with the Y gates of the banks B#1 to B#4.

In the configurations of the sense amplifiers shown in FIGS. 9A and 9B, one internal output circuit (15e or 25e) is provided in each sense amplifier and an occupying area of the sense amplifer circuit itself can be reduced. Therefore, the number of sense amplifier circuits not only can decrease, but an area of the sense amplifier circuits themselves also can decrease, with the result that a chip area can decrease as a whole. Operations of the sense amplifier circuits shown in FIGS. 9A and 9B are the same as the conventional sense amplifier circuit as shown in FIG. 18. When an external read operation is performed, the external read sense amplifier enable signal ZEXSE is activated. When a verify operation is performed, the verify sense amplifier enable signal ZVFSE is activated.

[Configuration of Write Circuit]

Figure 10A:
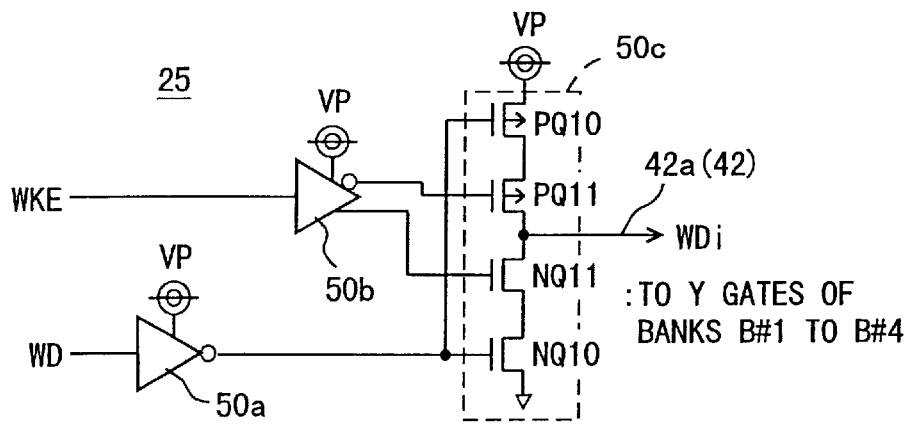
FIG. 10A is a circuit diagram representing a configuration of write circuit shown in FIG. 1.

FIG. 10A is a circuit diagram representing an example of configuration of a write circuit included in the block 25. In FIG. 10A, the write circuit includes: an inverter 50a having a level conversion function and inverting a logical level of a write data WD and converting a voltage level thereof; a level converter 50b converting a voltage level of a write circuit enable signal WKE and generating its complementary signal; and a write drive circuit 50c, enabled selectively in response to an output signal of the level converter 50b, for driving the internal data transmission line 42a (42) according to a signal supplied from the level inverter 50a having a level conversion function to generate an internal write data WDi. The internal data transmission line 42a (42) is coupled commonly with the Y gates of the banks B#1 to B#4.

The write drive circuit 50c includes: P channel MOS transistors PQ10 and PQ11 connected serially between a power supply node and the internal data transmission line 42a; and N channel MOS transistors NQ11 and NQ10 connected serially between the internal data transmission line 42a and the ground node. An output signal of the inverter 50a having a level conversion function is supplied to the gates of the MOS transistors PQ11 and NQ10. An inverted signal and a non-inverted signal from the level converter 50b are supplied to the MOS transistors PQ11 and NQ 11, respectively.

By applying the high voltage VP onto the power supply node, a high positive voltage is applied on the drain (a bit line) of a memory cell transistor when a programming operation is performed. In a case of a NOR flash memory, a higher program voltage VPP is applied on the gate (a word line) of a selected memory cell. In a case of a DINOR flash memory, a negative voltage is generally applied onto the gate (a word line) of a selected memory cell when a program operation is performed.

Figure 10B:
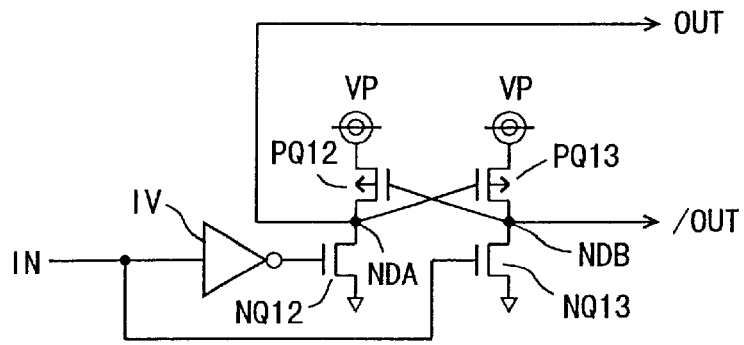
FIG. 10B is a circuit diagram representing a configuration of a level converter and an inverter with a level conversing function shown in FIG. 10A.

FIG. 10B is a circuit diagram schematically showing a configuration of the inverter 50a with a level conversion function and the level converter 50b shown in FIG. 10A. In FIG. 10B, the level converter (an inverter with a level conversion function) includes: an inverter IV receiving an input IN; an N channel MOS transistor NQ12 connected between a node NDA and a ground node, and receiving an output signal of the inverter IV at a gate thereof; an N channel MOS transistor NQ13 connected between a node NDB and a ground node, and receiving the input signal IN at a gate thereof; a P channel MOS transistor PQ12 connected between a high voltage supply node and the node NDA, and connected to the node NDB at a gate thereof; and a P channel MOS transistor PQ13 connected between the high voltage supply node and the node NDB, and connected to the node NDA at a gate thereof. An output signal OUT at the same logical level as the input signal IN is generated from the node NDA and an output signal /OUT obtained by inverting a logical level of the input signal IN is outputted from the node NDB. The inverter IV generates a signal with the same amplitude as the input signal IN.

In the level converter (the inverter with a level conversion function) shown in FIG. 10B, when the input signal IN is at H level or at the power supply voltage level, an output signal of the inverter IV goes to L level, the MOS transistor NQ13 is turned on and the MOS transistor NQ12 is turned off. A voltage level of the node NDB is lowered by the MOS transistor NQ13, the MOS transistor PQ12 is turned on, and the output signal OUT goes to H level, while the output signal /OUT supplied from the node NDB goes to L level. When the signals OUT and /OUT go to the high voltage VP and the ground voltage level, respectively, the MOS transistor PQ12 has the source and the drain set at the same voltage to be turned off and further, the MOS transistor PQ13 has the gate and the source set at the same voltage to be turned off.

When the input signal IN is at L level, an output signal of the inverter IV goes to H level. In this state, the MOS transistor NQ12 is on, the MOS transistor NQ13 is off, and the node NDA is discharged to L level, while the node NDB is charged by the MOS transistor 13.

Hence, the output signal OUT goes to L level and the output signal /OUT goes to H level (a high voltage VP level).

The inverter 50a with a level conversion function utilizes the output signal /OUT in the configuration shown in FIG. 10B. The level converter 50b supplies the output signal OUT to the gate of the N channel MOS transistor NQ 11, and its complementary output signal /OUT to the gate of P channel MOS transistor PQ11.

Therefore, in the write circuit shown in FIG. 10A, when the write circuit enable signal WKE is at L level of the inactive state, the MOS transistors PQ 11 and NQ 11 are both off and the write drive circuit 50c is put into an output high impedance state. When the write circuit enable signal WKE is activated at H level, the MOS transistors PQ11 and NQ11 are turned on, and one of the MOS transistors PQ10 and NQ 10 is turned on according to an output signal supplied from the inverter 50a with a level conversion function to generate the internal write data WDi. When the write data WD is at L level, an output signal of the inverter 50a with a level conversion function goes to H level (the high voltage VP level), the MOS transistor NQ10 is on, the MOS transistor PQ 10 is off, and the internal write data WDi on the internal data transmission line 42a (42) goes to L level at the ground voltage level.

When the write data WD is at H level, the MOS transistor PQ10 is on, the MOS transistor NQ10 is off, the internal write data WDi on the internal data transmission line 42a (42) goes to the high voltage VP level. When the internal write data WDi is at H level, programming on a selected memory cell is performed. When the internal write data WDi is at L level, no programming on a corresponding memory cell is performed, but the corresponding memory cell maintains an erased state.

It should be appreciated that the level converter 46 shown in FIG. 8 also has a configuration similar to that of the level converter shown in FIG. 10B. When no conversion of a logical level (inversion) is effected, the output signal OUT of FIG. 10B is used.

[Configuration of Internal Control Circuit]

Figure 11:
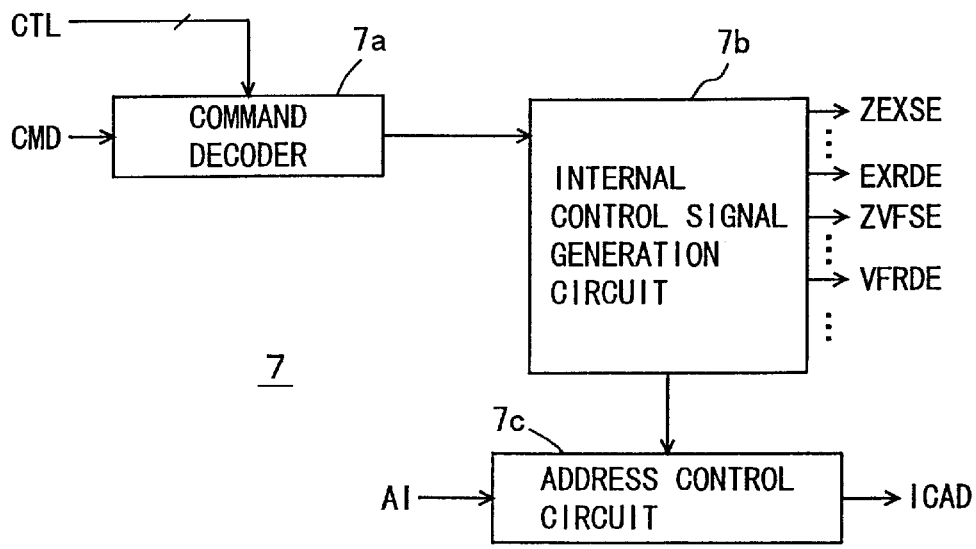
FIG. 11 is a block diagram schematically showing a configuration of an internal control circuit shown in FIG. 1.

FIG. 11 is a block diagram schematically showing a configuration of the internal control circuit 7 shown in FIG. 1. In FIG. 11, the internal control circuit 7 includes: a command decoder 7a taking in an externally supplied command CMD according to the control signal CTL and decoding the command CMD to generate an internal operation instruction signal; an internal control signal generation circuit 7b generating various internal control signals according to an operating mode specifying signal supplied from the command decoder 7a; and an address control circuit 7c, taking in the internal operation address signal AI according to a control signal supplied from the internal control signal generation circuit 7b and changing the address signal to generate the internal control address signal ICAD.

The internal control signal generation circuit 7b generates the external read sense amplifier enabling signal ZEXSE, the external read sense amplifier output enable signal EXRDE, the verify sense amplifier enable signal ZVFSE, the verify sense amplifier output enable signal VFRDE and the like. The internal control signal generation circuit 7b generally has a configuration like a sequence controller and not only generates control signals necessary in a programming/erase operation, but also performs control on a verification operation. An operation of each bank may be controlled by the internal control circuit 7 with a bank specifying signal supplied from the bank pointer 3 and alternatively such a configuration may be employed that the internal control circuit 7 generates a main control signal and a control signal for a bank is generated in each respective bank according to a bank specifying signal (an address decode operation is activated by a bank specifying signal).

As described above, according to the first embodiment of the present invention, the external read sense amplifier and the internal verify sense amplifier are separately provided from each other, and further the sense amplifiers are coupled to each bank through different paths, so that a chip occupancy area can be reduced with no degradation of the background operation function that while an internal operation is being performed in one bank, a data is read out from another bank.

[Second Embodiment]

Figure 12:
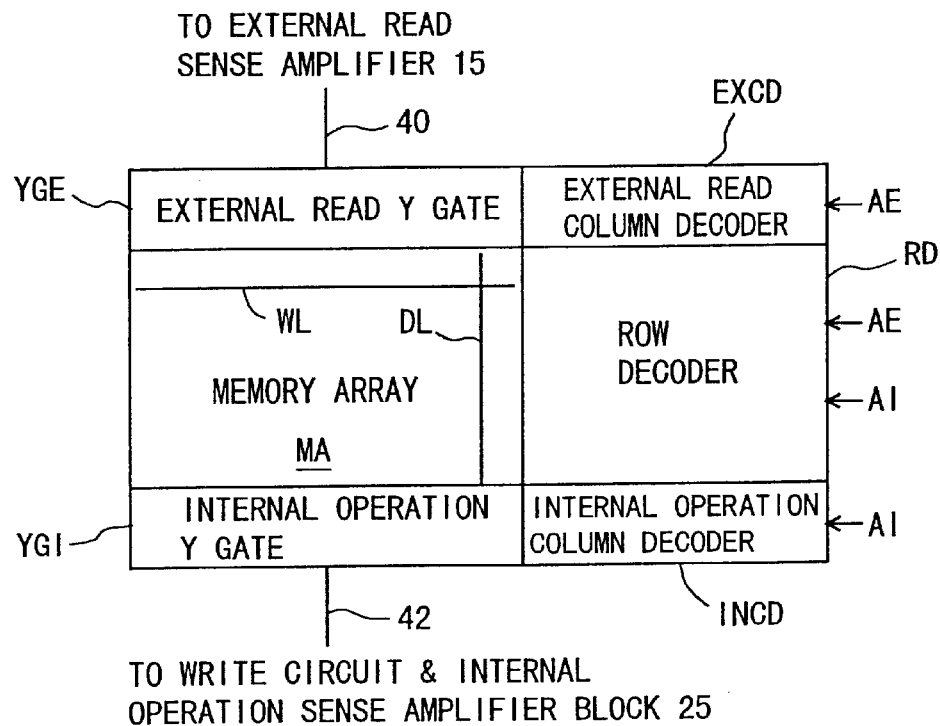
FIG. 12 is an illustration schematically showing a configuration of one bank of a nonvolatile semiconductor memory device according to a second embodiment of the present invention.

FIG. 12 is an illustration schematically showing a configuration of a main part of the nonvolatile semiconductor memory device according to a second embodiment of the present invention. In FIG. 12, a construction of one bank is representatively represented. In the second embodiment, the external read Y gate YGE and the internal operation Y gate YGI are arranged opposed to each other at both sides in the column direction of a memory array MA (in a direction in which internal data lines DL extend). The external read Y gate YGE couples a selected column of the memory array MA (a internal data line DL) with the external read sense amplifier 15 through the internal data transmission line 40 according to a column select signal supplied from the external read column decoder EXCD. The internal operation Y gate YGI couples a selected column line of the memory array MA to the write circuit and internal operation sense amplifier block 25 through the internal data transmission line 42 according to a column select signal supplied from the internal operation column decoder INCD.

The external read address signal AE is supplied to the external read column decoder EXCD, while the internal operation address signal AI is supplied to the internal operation column decoder INCD. The address signals AE and AI are both supplied to the row decoder RD. The address signals supplied to the decoders EXCD, INCD and RD are address signal bits other than the bank address signal bits. The row decoder RD selects a word line WL corresponding to an addressed row according to the address signals AE and AI, through a decoding operation when an external read operation or an internal operation is performed. Voltage levels of a selected word line and a column select signal are controlled according to an operating mode by the internal control circuit 7.

As shown in FIG. 12, since the Y gates are arranged separately at both sides of the memory array MA for an external read operation and for an internal operation, therefore a layout pattern different from the first embodiment can be realized. Generally, a chip shape of a semiconductor memory device is dependent on a shape of a package in which a nonvolatile semiconductor memory device is housed. By altering this layout pattern, a chip shape is adjusted so as to conform to a shape of a housing package.

Figure 13:
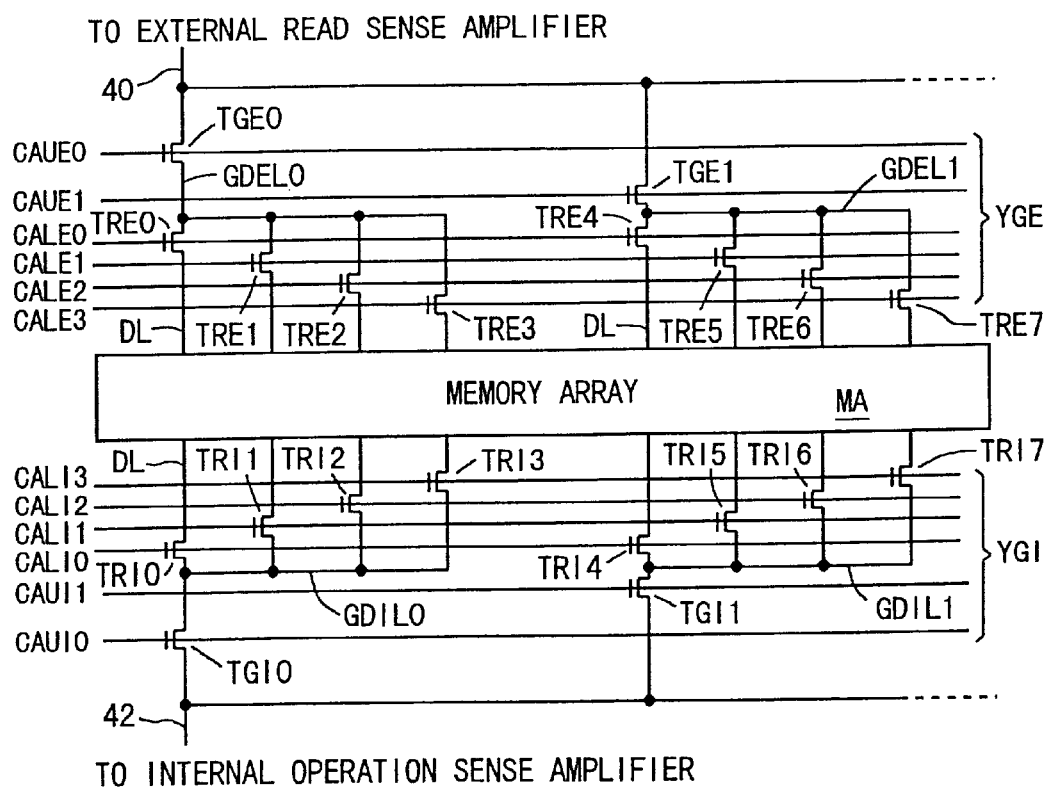
FIG. 13 is a circuit diagram representing a configuration of a Y gate shown in FIG. 12.

FIG. 13 is a circuit diagram representing an example of construction of the Y gate shown in FIG. 12. In FIG. 13, the external read Y gate YGE includes: transfer gates TRE0 to TRE3 connecting corresponding internal data lines DL of the memory array MA to a global data line GDEL0 when made conductive in response to column select signals CALE0 to CALE3, respectively; transfer gates TRE4 to TRE7 connecting corresponding internal data lines DL of the memory array MA to a global data line GDEL1, when made conductive in response to the column select signals CALE0 to CALE3, respectively; a transfer gate TGE0 connecting the global data line GDEL0 to the internal data transmission line 40 in response to the column group select signal (a path select signal) CAUE0; and a transfer gate TGE1 connecting the global data line GDEL1 to the internal data transmission line 40 in response to the column group select signal CAUE1.

The column select signals CALE0 to CALE3 and the column block select signals CAUE0 and CAUE1 are supplied from the external read column decoder EXCD shown in FIG. 12.

The internal operation Y gate YGI includes: transfer gates TRI0 to TRI3 provided for a group of internal data lines of the memory array MA, and made conductive in response to the respective column select signals CALI0 to CALI3 to connect corresponding columns to the global data line GDIL0; transfer gates TRI4 to TRI7 provided for another group of internal data lines of the memory array MA, and connecting corresponding columns to the global data line GDIL1 in response to the respective column select signals CALI0 to CALI3; a transfer gate TGI0 made conductive in response to the column block select signals CAUI0, and connecting the internal global data line DGIL0 to the internal data transmission line 42; and a transfer gate TGI1 made conductive in response to the column global select signal CAUI1 to connect the internal global data line DGIL1 to the internal data transmission line 42.

In the Y gate YGE, one column is selected from each of column blocks according to the column select signals CALE0 to CALE3 and one column block is selected according to the column block select signals CAUE1 and CAUE0. In the Y gate YGI, likewise, one column is elected from each of column blocks according to the column select signals CALI0 to CALI3 and one column block is selected according to he column block select signals CAUI0 and CAUI1.

The column select signals CALI0 to CALI3 and the column block select signals CAUI0 and CAUI1 are supplied from the internal operation column decoder INCD shown in FIG. 12. The external read column decoder EXCD and the internal operation column decoder INCD are activated according to bank specifying signals when an external read operation and an internal operation are performed, respectively. Therefore, in the configurations shown in FIGS. 12 and 13 as well, the external read sense amplifier and the internal operation sense amplifier are coupled to the memory array MA through different paths (the internal transmission lines 40 and 42), and therefore, while an internal operation (an erase/programming operation) is performed in one memory array (bank), data reading can be performed on another bank.

FIG. 14A is a circuit diagram representing a configuration of the external read column decoder EXCD shown in FIG. 12. In FIG. 14A, the external read column decoder EXCD includes: inverters 50a to 50c receiving address signal bits (or a predecode signal bits) AE<2> to AE<0>; AND decode circuits 50d and 50e activated when the bank specifying signal EBP_X is activated, and generating the column block select signals CAUE0 and CAUE1, respectively, according to a prescribed set of address signal bits; and AND decode circuits 50f to 50i activated when the bank specifying signal EBP_X is activated, and generating the column select signals CALE0 to CALE3, respectively, according to address signal bits (or predecode signal bits) AE<1:0> and /AE<1:0>.

The AND decode circuit 50d receives an output signal /AE<2> of the inverter 50a and the bank specifying signal EBP_X to generate the column block select signal CAUE0. The AND decode circuit 50e receives address signal bit (or a predecode signal bit, hereinafter simply referred to as an address signal bit) AE<2> and the bank specifying signal EBP_X to generate the column block select signal CAUE1. The AND decode circuit 50f receives address signal bits /AE<1> and /AE<0> from the inverter circuits 50b and 50c and the bank specifying signal EBP_X to generate the column select signal CALE0. The AND decode circuit 50g receives address signal bits /AE<1> and AE<0> and the bank specifying signal EBP_X to generate the column select signal CALE1.

The AND decode circuit 50h receives address signal bits AE<1> and /AE<0> and the bank specifying signal EBP_X to generate the column select signal CALE2. The AND decode circuit 50i receives address signal bits AE<1> and AE<0> and the bank specifying signal EBP_X to generate the column select signal CALE3.

Level converters 51 performing level conversion of the select signals CAUE0, CAUE1 and CALE0 to CALE3 supplied from the AND decode circuits 50d to 50i are provided corresponding to the respective AND decode circuits 50d to 50i in an output of the external read column decoder EXCD. The level converters 51 only converts a voltage level of a supplied signal to the high voltage VP from the operating power supply voltage, and performs no conversion of a logical level. The level converter 51 is the same in configuration as that shown in FIG. 10B, for example, and receives a corresponding select signal as the input IN to generate the output signal OUT.

The external read column decoder EXCD performs decoding when the external read bank specifying signal EBP_X supplied from the bank pointer goes to H level in the active state, to drive a column block select signal and a column select signal to the active states (to the high voltage VP level) according to the address bits AE<2:0>. When the external read bank specifying signal EBP_X is at L level at the inactive state, the column select signals CALE0 to CALE3 and the column block select signals CAUE0 and CAUE1 are all at L level.

FIG. 14B is a circuit diagram representing a configuration of the internal operation column decoder INCD shown in FIG. 12. In FIG. 14B, the internal operation column decoder INCD includes: inverters 52a to 52c inverting the address bits AI<2:0>, respectively; an AND decode Circuit 52d receiving the complementary address signal bit /AI <2> from the inverter 52a and the bank specifying signal IBP_X to generate the column block select signal CAUI0; an AND decode circuit 52e receiving the address signal bit /AI <2> and the bank specifying signal IBP_X to generate the column block select signal CAUI1; and 3-input AND decode circuits 52f to 52i generating the column select signals CALI0 to CALI3 according to the address signal bits AI <1:0> and /AI<1:0>, and the bank specifying signal IBP_X.

The AND decode circuit 52f receives the complementary address signal bits /AI<1: 0>from the inverters 52b and 52c, and the bank specifying signal IBP_X to generate the column select signal CALI0. The AND decode circuit 52g receives the address signal bits /AI<1> and A<0> and the bank specifying signal IBP_X to generate the column select signal CALI1. The AND decode circuit 52h receives the address signal bits AI<1> and /AI<0> and the bank specifying signal IBP_X to generate the column select signal CALI2. The AND decode circuit 52i receives the address signal bits AI<1> and AI<0> and the bank specifying signal IBP_X to generate the column select signal CALI3.

In the internal operation column decoder INCD as well, level converters 53 performing level conversion of the select signals are provided corresponding to the respective AND decode circuits 52d to 52i. The level converters 53 each have a configuration similar to the level converter shown in FIG. 10B and convert voltage levels of the select signals CAUI0, CAUI1 and CALI0 to CALI3 supplied from the corresponding AND decode circuits 52d to 52i from the operating power supply voltage to the high voltage VP level. With the level converters 53 in use, a high programming voltage can be transmitted onto a selected column when programming is performed.

The internal operation column decoder INCD shown in FIG. 14B as well performs decoding when activated in response to the internal operation bank specifying signal IBP_X being at H level or the active state. When the bank specifying signal IBP_X is at L level of the inactive state, the column block select signals CAUI0 and CAUI1, and the column select signals CALI0 to CALI3 are all at L level of the inactive state.

As shown in FIGS. 14A and 14B, when the column decoders EXCD and INCD are activated by the external read bank specifying signal EBP_X and the internal operation bank specifying signal IBP_X, respectively, a correct column select operation according to an operation to be performed, can be ensured.

It should be appreciated that column predecoders for external reading and for an internal operation are provided at the preceding stages of the respective column decoders EXCD and INCD, and further that the number of address signal bits is also set according to the number of column blocks included in a memory array and the number of columns included in each of column blocks.

The bank specifying signals EBP_X and IBP_X are generated using a bank pointer having a configuration similar to the bank pointer in the first embodiment described previously.

The number of address bits used for the bank specifying signals EBP_X and IBP_X generated from the bank pointer 3 is also adjusted according to the number of banks included in the nonvolatile semiconductor memory device.

Figure 15:
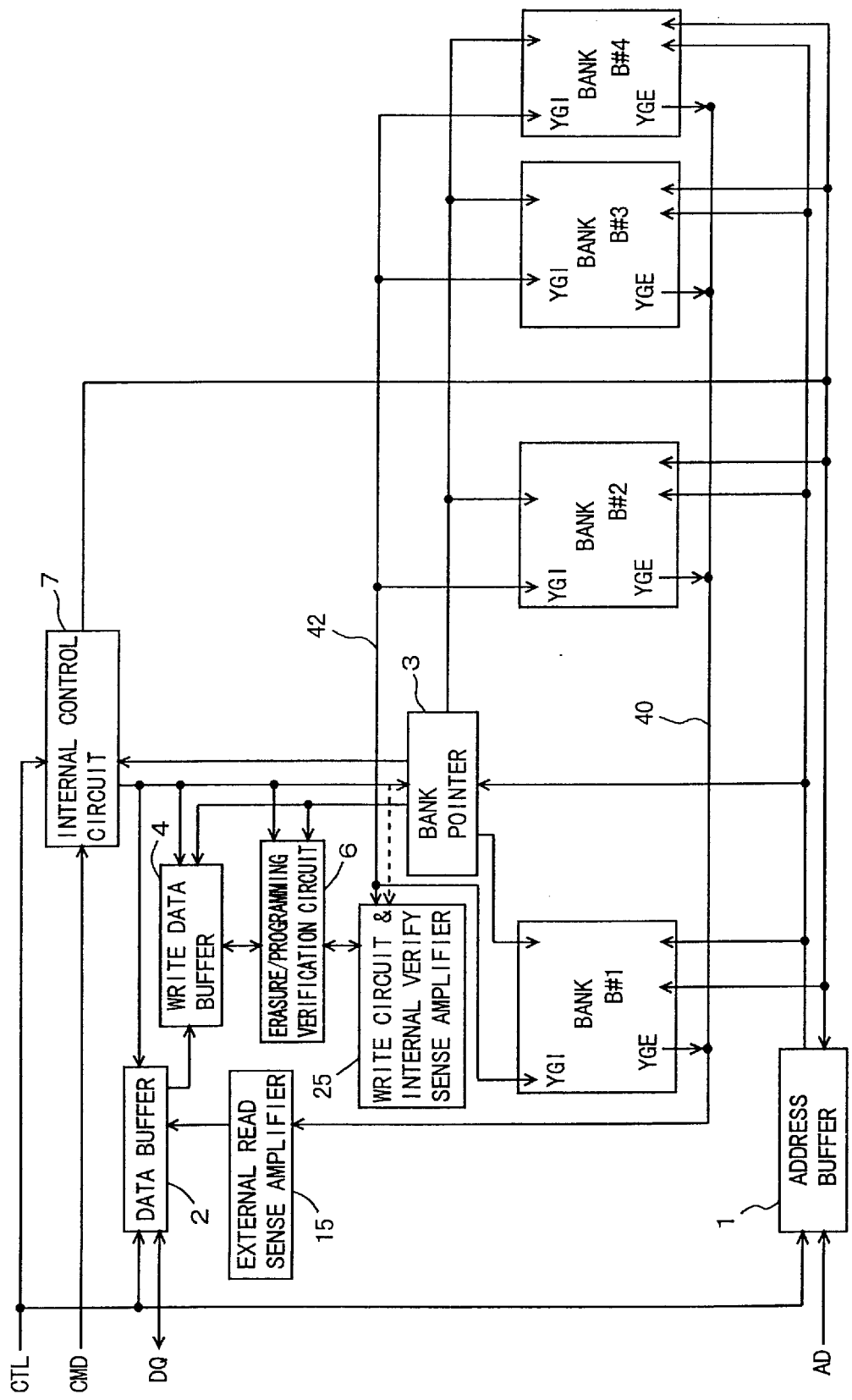
FIG. 15 is a block diagram schematically showing the entire configuration of the nonvolatile semiconductor memory device according to the second embodiment of the present invention.

FIG. 15 is a block diagram schematically showing the entire configuration of the nonvolatile semiconductor memory device according to the second embodiment of the present invention. In FIG. 15, the banks B#1 to B#4 are provided. The internal operation gates YGI of the respective banks B#1 to B#4 are commonly coupled with the internal data transmission line 42. The internal data transmission line 42 is coupled to the write circuit and internal verify sense amplifier block 25.

On the other hand, the external read Y gates YGE of the respective banks B#1 to B#4 are coupled with the external read sense amplifier 15 through the internal data transmission line 40. The internal data transmission lines 42 and 40 are disposed, on opposing sides of the banks B#1 to B#4 corresponding to the Y gates YGI and YGE provided opposingly at both ends of each of the banks B#1 to B#4. With such a configuration, the write circuit and internal verify sense amplifier block 25 and the external read sense amplifier 15 have a higher degree of freedom in placement, and a chip layout can be altered so as to conform to a package shape. The write circuit and internal verify sense amplifier block 25 and the external read sense amplifier 15 can be placed at optimal positions according to locations of the banks B#1 to B#4, thereby improving an areal utilization efficiency to enable a layout area to decrease. The other circuits 2 to 4, 6 and 7 are also optimally placed accordingly, as are in the configuration shown in. FIG. 1.

[Modification 1]

Figure 16:
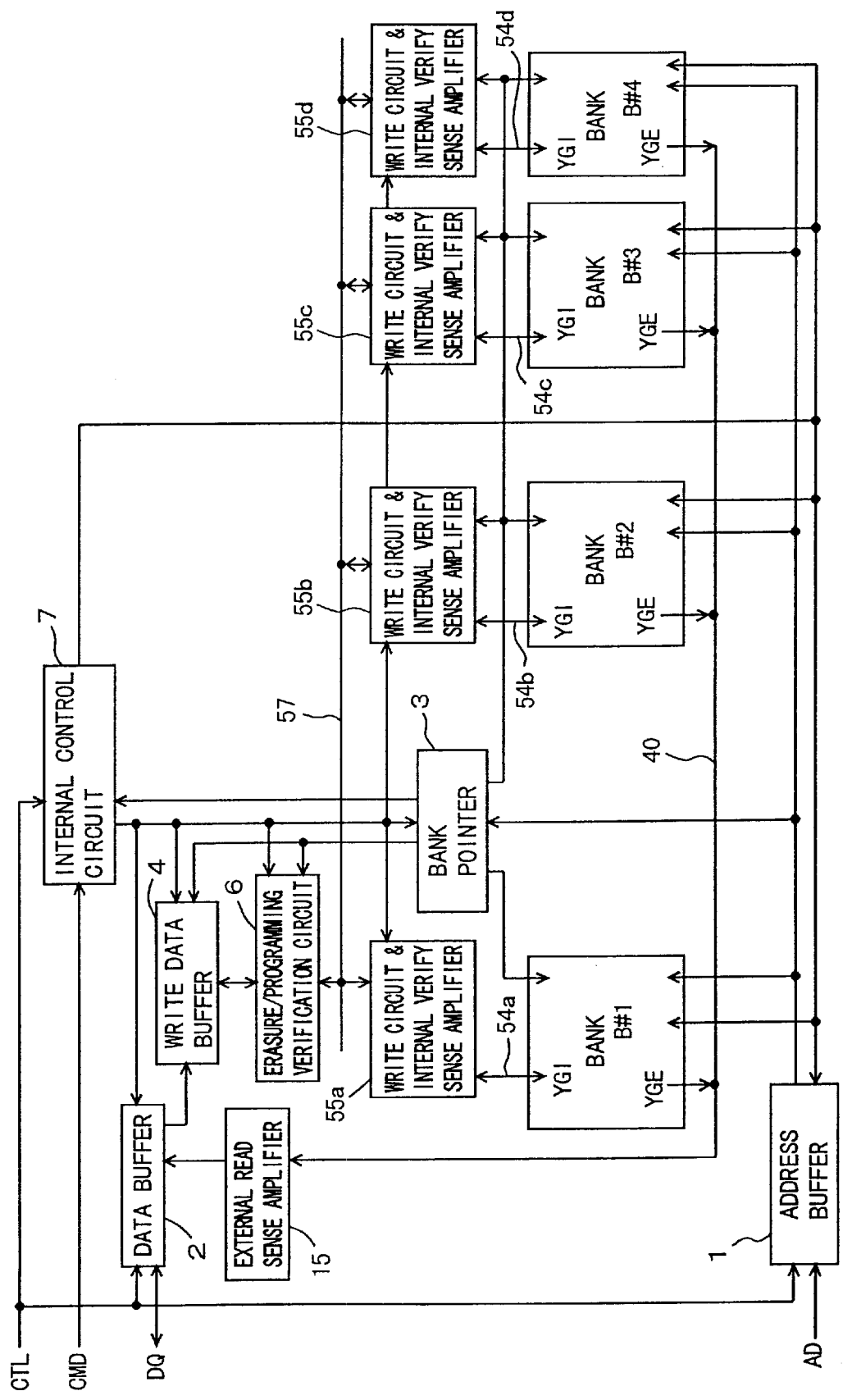
FIG. 16 is a block diagram schematically showing a configuration of a modification of the second embodiment of the present invention.
Figure 17:
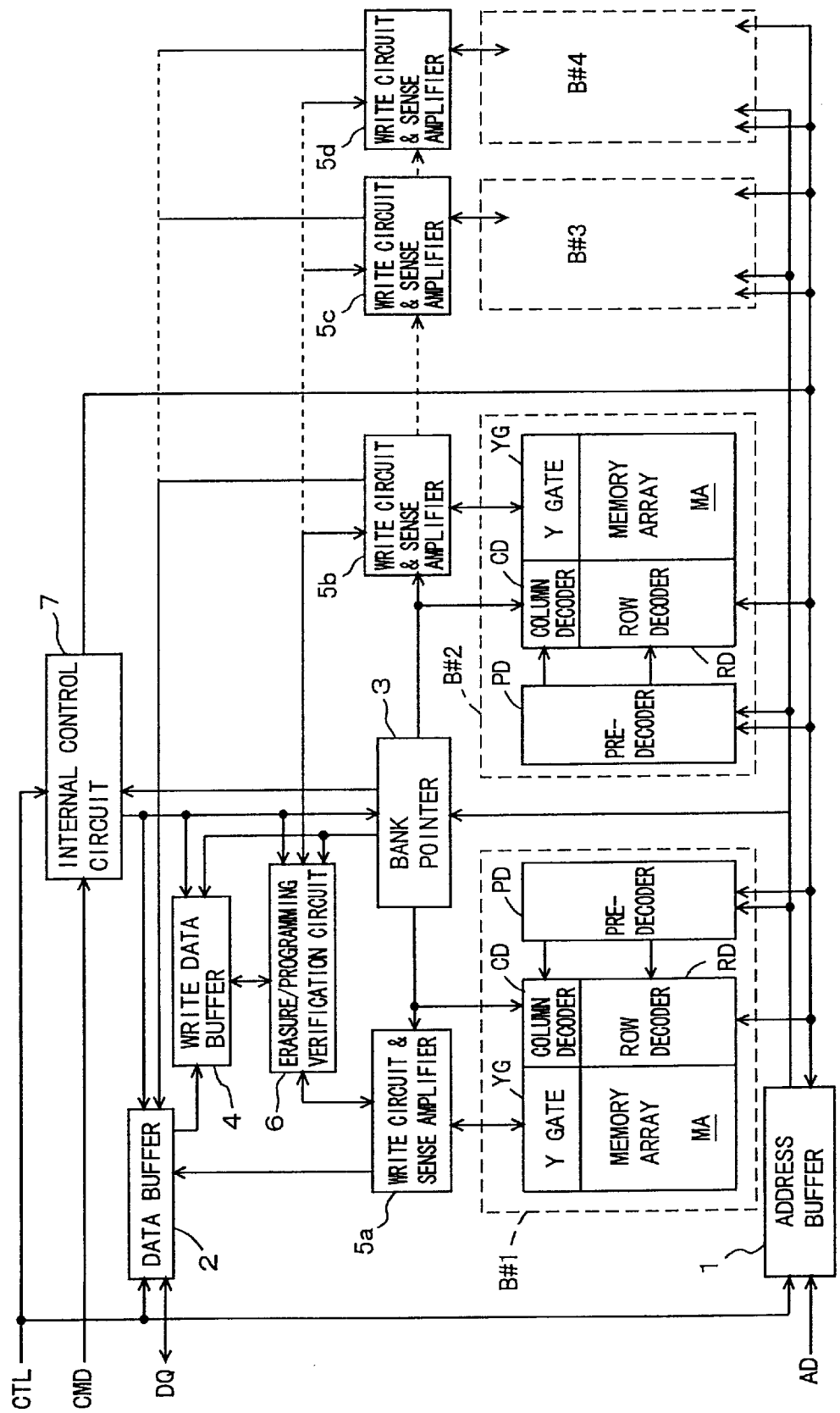
FIG. 17 is a block diagram schematically showing the entire configuration of a conventional nonvolatile semiconductor memory device.

FIG. 16 is a block diagram representing a configuration of a modification of a nonvolatile semiconductor memory device according to the second embodiment of the present invention. In the configuration shown in FIG. 16, the internal operation Y gates YGI and the external read Y gates YGE are provided in pairs to the respective banks B#1 to B#4. The write circuit and internal verify sense amplifier blocks 55a to 55d are provided corresponding to the respective banks B#1 to B#4. The write circuit and internal verify sense amplifier blocks 55a to 55d are coupled commonly to the erasure/programming verification circuit 6 through the global internal data transmission line 57. Further, the write circuit and internal verify sense amplifier blocks 55a to 55d are coupled with the internal operation Y gates YGI of the corresponding banks B#1 to B#4 through the internal data transmission lines 54a to 54d.

The external read Y gates YGE of the banks B# to B#4 are coupled commonly with the external read amplifier 15 through the internal data transmission line 40.

In the configuration shown in FIG. 16, the internal verify sense amplifiers are provided corresponding to the respective banks B#1 to B#4. However, the internal verify sense amplifiers each have one data transmission line, and two internal output circuits for external reading and for verifying are not required for one sense amplifier unlike a conventional practice, and therefore an area required for the internal verify sense amplifiers can be reduced as compared with a conventional practice, thereby enabling a chip area to further decrease, as compared with a conventional memory array.

Further, since the Y gate YGI for internal operation and the Y gate YGE for external reading are provided in each of the banks B#1 to B#4, the write circuit and internal verify sense amplifier blocks 55a to 55d can be efficiently placed in a chip, thereby enabling a chip area utilization efficiency to increase to decrease a chip area.

The write circuit and internal verify sense amplifier blocks 55a to 55d are selectively activated in response to a control signal and a control voltage supplied from the internal control circuit 7 and a bank specifying signal supplied from the bank pointer 3. The other part of the configuration is the same as the corresponding part of the configuration shown in FIG. 15 and the corresponding parts are indicated by the same reference numerals.

It should be appreciated that in the configuration shown in FIG. 16, the write circuit and internal verify sense amplifier blocks are provided corresponding to the respective banks B#1 to B#4. However, such a configuration may be adopted that one write circuit and internal verify sense amplifier block is allocated commonly to each set of a prescribed number of banks. Such a further configuration may be adopted that one write circuit is provided commonly to the bank B#1 to B#4 while the internal verify sense amplifiers are provided corresponding to the respective bank B#1 to B#4.

As described above, according to the second embodiment of the present invention, since the Y gate for internal operation and the Y gate for external reading are separately provided in a pair in each of the banks B#1 to B#4, a layout of the internal circuitry can be optimized with ease to efficiently place components of the internal circuitry, thereby enabling a chip area to decrease through improvement on area utilization efficiency. Further, since an improved degree of freedom is enjoyed in designing of the layout of the internal circuit, a shape of a chip is easily altered according to a shape of a package, and alteration in the layout can be dealt with ease.

[Other Configurations]

While in the first and second embodiments, the number of banks is 4, there is no specific limitation to this number of 4, but the other number of banks may be adopted.

Further, a nonvolatile semiconductor memory device may be any of a NOR flash memory, a DINOR flash memory, an AND flash memory and a NAND flash memory, and the present invention can be applied to any type of nonvolatile semiconductor memory devices as far as the devices have the background operation function that while an internal operation is operated in one bank, a data is read out from another bank.

Still further, a plurality of banks may be of the same size (of storage capacity) and may be of different storage capacities as well.

Yet further, in FIGS. 1, 15 and 16, a bank specifying signal from the bank pointer 3 is supplied to the write data buffer 4 and the erasure/programming verification circuit 6 in order to enable the circuits 4 and 6 when the bank specifying signal for internal operation is activated. However, the circuits 4 and 6 may be collectively controlled by the internal control circuit 7 regardless of a selected bank.

As described above, according to the present invention, since the sense amplifier for internal operation and the sense amplifier for external data reading are separately provided internally, a configuration that the sense amplifiers are connected to the banks through different paths, ensures easy realization of not only decrease in occupancy area of the sense amplifiers but also an improved degree of freedom in layout without any degradation of the background operation function, thereby enabling implementation of a nonvolatile semiconductor memory device excellent in area utilization efficiency.

Although the present invention has been described and illustrated in detail, it is clearly understood that the same is by way of illustration and example only and is not to be taken by way of limitation, the spirit and scope of the present invention being limited by the terms of the appended claims.

What is claimed is:

1. A nonvolatile semiconductor memory device comprising:
   a plurality of memory banks each comprising a plurality of nonvolatile memory cells, and memory cell selection circuitry for selecting a memory cell in accordance with an address signal, the banks performing a memory cell selection independently of each other;
   at least one sense amplifier for read operation, provided corresponding to a prescribed number of memory banks of said plurality of memory banks, for externally outputting a data read out from a corresponding memory bank through a buffer circuit; and
   at least one sense amplifier for internal operation, provided for the plurality of memory banks separately from said at least one sense amplifier for read operation, for reading out a memory cell data from a related memory bank of the memory banks for a prescribed internal operation.

2. The nonvolatile semiconductor memory device according to claim 1, wherein said at least one sense amplifier for read operation comprises one sense amplifier circuit provided commonly to said plurality of memory banks.

3. The nonvolatile semiconductor memory device according to claim 1, wherein said at least one sense amplifier for internal operation comprise a plurality of sense amplifier circuits provided corresponding to the respective memory banks.

4. The nonvolatile semiconductor memory device according to claim 1, wherein said at least sense amplifier for internal operation includes a sense amplifier for internal operation provided commonly to said plurality of banks.

5. The nonvolatile semiconductor memory device according to claim 1, said selection circuitry of each bank includes connection circuits each for connecting a corresponding sense amplifier for read operation and a corresponding sense amplifier for internal operation to a corresponding memory bank through different paths.

6. A nonvolatile semiconductor memory device comprising:
- a memory array having a plurality of nonvolatile memory cells arranged in a matrix of rows and columns;
- a plurality of bit lines provided corresponding to the columns of the memory cells, each for communicating data with a selected memory cell on a corresponding column in an external data read operation and in an internal data read operation;
- an external sense amplifier circuit for reading out a data of a selected memory cell of said memory array externally;
- a sense amplifier for internal operation, provided separately from said external sense amplifier circuit, for reading out a data of a selected memory cell of said memory array for a prescribed internal operation in said internal data read operation; and
- a select circuit for coupling a bit line provided corresponding to a selected memory cell of said memory array to said external sense amplifier circuit and said sense amplifier for internal operation through different paths provided outside said memory array.

7. The nonvolatile semiconductor memory device according to claim 6, wherein said select circuit comprises:
- a first column select circuit for selecting a column of said memory array according to a first column select signal;
- a second column select circuit for selecting a column of said memory array according to a second column select signal;
- a first path select circuit for coupling the column selected by said first column select circuit with said external sense amplifier circuit according to a first path select signal; and
- a second path select circuit for coupling the column selected by said second column select circuit with said sense amplifier for internal operation according to a second path select signal.

8. The nonvolatile semiconductor memory device according to claim 7, wherein the first and second column select circuits are provided opposed to each other at both sides of said memory array.

9. The nonvolatile semiconductor memory device according to claim 7, further comprising a write circuit, coupled to said second path select circuit, for transmitting a write data to a selected memory cell of said memory array.

10. The nonvolatile semiconductor memory device according to claim 6, wherein said select circuit comprises:
- a column select circuit for selecting a column of said memory array according to a column select signal;
- a first path select circuit for coupling the column selected by said column select circuit to said external sense amplifier circuit according to a first path select signal; and
- a second path select circuit for coupling the column selected by said column select circuit to said sense amplifier for internal operation according to a second path select signal.

11. The nonvolatile semiconductor memory device according to claim 10, further comprising a write circuit, coupled to said second path select circuit, for transmitting a write data to a selected memory cell column of said memory array.

12. A non-volatile semiconductor memory device capable of performing a background operation, comprising:
- a plurality of memory cell arrays, provided individually and separately, each including a plurality of memory cells;
- a plurality of internal data read routes, provided for each memory cell array, extending outside said plurality of memory cell array, said plurality of internal data read routes being provided per a selected memory cell in each memory cell array; and
- a plurality of read out circuits provided corresponding to each memory cell array, each for reading out data of the selected memory cell in a corresponding memory cell array, the plurality of read out circuits for each memory cell array being coupled to different routes of said plurality of internal data read out routes, respectively.

* * * * *